(12) United States Patent
Park et al.

(10) Patent No.: US 12,550,552 B2
(45) Date of Patent: Feb. 10, 2026

(54) DISPLAY APPARATUS

(71) Applicant: Samsung Display Co., Ltd., Yongin-si (KR)

(72) Inventors: Hyungjun Park, Yongin-si (KR); Joongsoo Moon, Yongin-si (KR); Junyong An, Yongin-si (KR); Nuree Um, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 516 days.

(21) Appl. No.: 17/978,833

(22) Filed: Nov. 1, 2022

(65) Prior Publication Data

US 2023/0232676 A1 Jul. 20, 2023

(30) Foreign Application Priority Data

Jan. 17, 2022 (KR) .......................... 10-2022-0006801

(51) Int. Cl.
*H10K 59/131* (2023.01)

(52) U.S. Cl.
CPC ................................ *H10K 59/131* (2023.02)

(58) Field of Classification Search
CPC .. H10K 59/131; H10K 59/121; H10K 50/813; H10D 86/441; G09G 2/3233; G09G 2300/0426
See application file for complete search history.

(56) References Cited

U.S. PATENT DOCUMENTS

| | | |
|---|---|---|
| 11,177,337 B2 | 11/2021 | Seo et al. |
| 11,404,512 B2 | 8/2022 | Kim et al. |
| 11,751,463 B2 | 9/2023 | Choi et al. |
| 2020/0243790 A1* | 7/2020 | Lee ................... H10K 50/8445 |
| 2022/0093708 A1 | 3/2022 | Cho et al. |

FOREIGN PATENT DOCUMENTS

| | | |
|---|---|---|
| CN | 110112176 A | 8/2019 |
| CN | 111063719 A | 4/2020 |
| CN | 111710276 A | 9/2020 |
| CN | 111725287 A | 9/2020 |
| CN | 112038373 A | 12/2020 |

(Continued)

*Primary Examiner* — Brigitte A Paterson
(74) *Attorney, Agent, or Firm* — Womble Bond Dickinson (US) LLP

(57) ABSTRACT

A display apparatus includes a substrate including a component area, a first adjacent area and a second adjacent area arranged with the component area therebetween, and a main area at least partially surrounding the component area and the adjacent areas in plan view, a first display element in the component area and including a pixel electrode, an emission layer on the pixel electrode, and a counter electrode, a second display element, a first pixel circuit electrically connected to the first display element, and a second pixel circuit electrically connected to the second display element, in the adjacent area, a signal wiring in the component area, adjacent to the pixel electrode, and extending in a first direction from a boundary where the component area contacts the first adjacent area, and a connection wiring adjacent to the pixel electrode and electrically connecting the first display element to the first pixel circuit.

20 Claims, 15 Drawing Sheets

(56) References Cited

FOREIGN PATENT DOCUMENTS

| | | |
|---|---|---|
| CN | 113178473 A | 7/2021 |
| KR | 10-2020-0097371 A | 8/2020 |
| KR | 10-2021-0000799 A | 1/2021 |
| KR | 10-2021-0081572 A | 7/2021 |
| KR | 10-2021-0103632 A | 8/2021 |
| KR | 10-2022-0041286 A | 4/2022 |

* cited by examiner

DISPLAY APPARATUS

CROSS-REFERENCE TO RELATED APPLICATION

This application claims priority to, and the benefit of, Korean Patent Application No. 10-2022-0006801, filed on Jan. 17, 2022 in the Korean Intellectual Property Office, the disclosure of which is incorporated by reference herein in its entirety.

BACKGROUND

1. Field

One or more embodiments relate to display apparatuses having a component area for performing various functions while displaying an image.

2. Description of the Related Art

Recently, use of display apparatuses has been diversified. Furthermore, display apparatuses are getting thinner and lighter, so the scope of a use thereof is expanding.

As the size of an image display area in a display apparatus expands, various functions adopted by or linked to the display apparatus are being added. As a method of adding various functions, research into a display apparatus having a component area for performing various functions while displaying an image has continuously been performed.

SUMMARY

A component area needs to maintain a relatively high transmittance of light, sound, or the like to perform a function thereof. Accordingly, a pixel circuit for driving a display element may be omitted from the component area. In this case, the pixel circuit for driving the display element may be arranged in an adjacent area close to the component area so as not to be overlapped with the component area.

To drive the pixel circuit and the display element that are arranged apart from each other, a connection wiring that extends from the adjacent area to the component area may be arranged. In this state, the transmittance of the component area may be reduced due to the connection wiring and the signal wiring.

One or more embodiments include display apparatuses including a component area that has high transmittance. However, the scope of the present disclosure is not limited thereby.

Additional aspects will be set forth in part in the description which follows and, in part, will be apparent from the description, or may be learned by practice of the presented embodiments of the disclosure.

According to an aspect of the disclosure, a display apparatus includes a substrate including a component area, an adjacent area including a first adjacent area and a second adjacent area arranged with the component area therebetween, and a main area at least partially surrounding the component area and the adjacent area in plan view, a first display element in the component area and including a pixel electrode, an emission layer on the pixel electrode, and a counter electrode, a second display element, a first pixel circuit electrically connected to the first display element, and a second pixel circuit electrically connected to the second display element, in the adjacent area, a signal wiring in the component area, adjacent to the pixel electrode, and extending in a first direction from a boundary where the component area contacts the first adjacent area, and a connection wiring adjacent to the pixel electrode and electrically connecting the first display element to the first pixel circuit.

The first pixel circuit may include a first thin film transistor and a second thin film transistor, wherein the first thin film transistor includes a first semiconductor layer, a first gate electrode, an upper electrode, and a first source-drain electrode, wherein the second thin film transistor includes a second semiconductor layer, a second gate electrode, and a second source-drain electrode, and wherein the connection wiring includes connection wiring lines including a same material as the first gate electrode, the upper electrode, the second gate electrode, or the first source-drain electrode.

The display apparatus may further include a first organic insulating layer, a second organic insulating layer, and a third organic insulating layer that are sequentially stacked between the first pixel circuit and the first display element, wherein the connection wiring lines further include a transparent connection wiring between the second organic insulating layer and the third organic insulating layer and including a transparent conductive material.

The component area may include a first boundary area contacting the first adjacent area, a second boundary area contacting the second adjacent area, and a central area between the first boundary area and the second boundary area, wherein one of the connection wiring lines having an end portion in the central area includes a transparent conductive material, and wherein another of the connection wiring lines having an end portion in the first boundary area or the second boundary area includes a metal material.

The signal wiring may include signal wiring lines including a same material as the first gate electrode, the upper electrode, or the second gate electrode.

Some of the connection wiring lines and some of the signal wiring lines may overlap each other on a plane.

Some of the connection wiring lines may include partial connection wiring lines including a same material as the first gate electrode, the upper electrode, the second gate electrode, or the first source-drain electrode.

The connection wiring may include connection wiring lines, wherein a number of the connection wiring lines decreases as a distance from any one of respective boundaries, where the component area contacts the first adjacent area and the second adjacent area, toward a center of the component area increases.

The signal wiring may include signal wiring lines, wherein a number of the signal wiring lines is the same at a boundary where the component area contacts the first adjacent area as at a boundary where the component area contacts the second adjacent area.

The component area may extend in the first direction, and may include pixel areas, in which pixel electrodes, which include the pixel electrode, are arranged, and transmission areas between the pixel areas, wherein the counter electrode defines openings overlapping the transmission areas.

The openings may have an oval shape having a major axis parallel to the first direction.

The openings may have an area overlapping the connection wiring, and decreasing toward a center of the component area from respective boundaries where the component area contacts the first adjacent area and the second adjacent area.

The connection wiring and the signal wiring may overlap one of the pixel areas.

The connection wiring may overlap one of the transmission areas at respective boundaries where the component area contacts the first adjacent area and the second adjacent area.

The display apparatus may further include connection data lines arranged in the component area and extending in a second direction crossing the first direction, wherein the component area includes a first boundary area contacting the first adjacent area, a second boundary area contacting the second adjacent area, and a central area between the first boundary area and the second boundary area, and wherein the connection data lines overlap the first boundary area or the second boundary area.

The display apparatus may further include a first organic insulating layer and a second organic insulating layer that are sequentially stacked between the first pixel circuit and the first display element, wherein the connection data lines include a lower data line below the first organic insulating layer, and an upper data line between the first organic insulating layer and the second organic insulating layer.

The display apparatus may further include a first adjacent data line in the adjacent area and electrically connected to the first pixel circuit, and a second adjacent data line in the adjacent area and electrically connected to the second pixel circuit.

The first adjacent data line and the second adjacent data line may respectively include first adjacent data lines and second adjacent data lines that are alternately arranged.

The first adjacent data line may be integrated chip (IC) mapped corresponding to a location of the first display element.

The first display element may include first display elements, and the display apparatus further includes an auxiliary wiring that electrically connects any one of the first display elements to another of the first display elements.

Aspects other than those described above will become apparent from the following drawings, claims, and detailed description of the disclosure

BRIEF DESCRIPTION OF THE DRAWINGS

The above and other aspects of embodiments of the disclosure will be more apparent from the following description, taken in conjunction with the accompanying drawings, in which.

DETAILED DESCRIPTION

Figure 1:
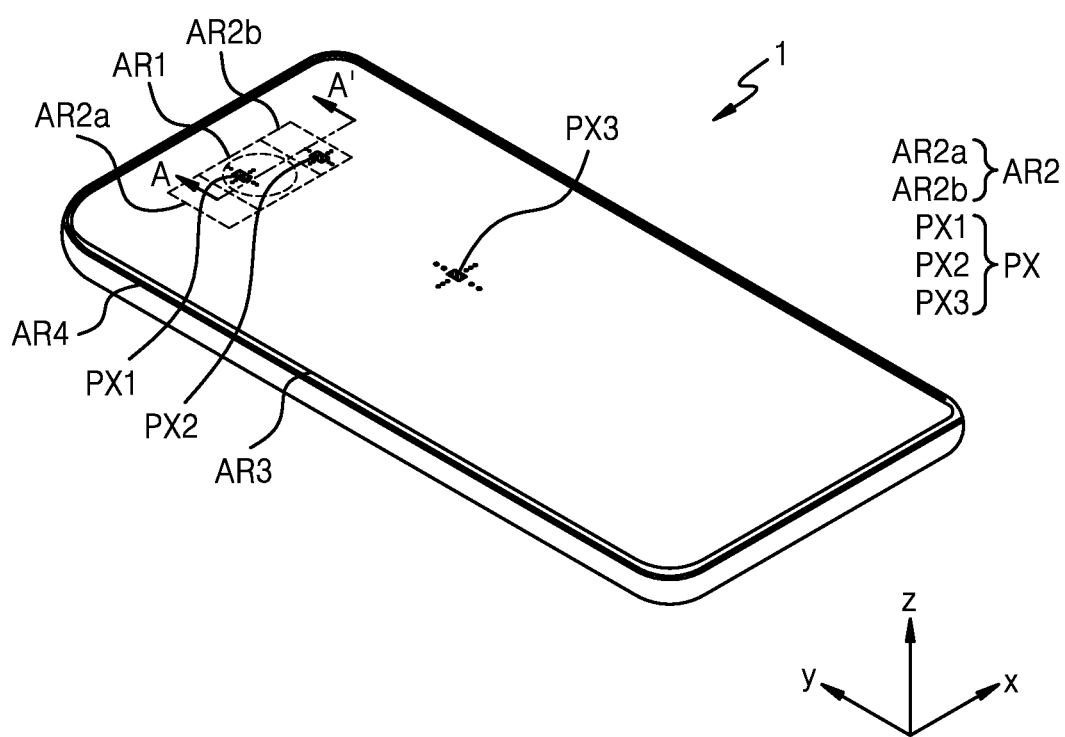
FIG. 1 is a schematic perspective view of a display apparatus according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a display apparatus 1 according to one or more embodiments.

Referring to FIG. 1, the display apparatus 1 may display an image. The display apparatus 1 may include a pixel PX. The pixel PX may be defined as an area in which a display element emits light. The pixel PX may include a plurality of pixels in the display apparatus 1. The pixels PX each may emit light, and the pixels PX may display an image. In one or more embodiments, the pixel PX may include a first pixel PX1, a second pixel PX2, and a third pixel PX3.

The display apparatus 1 may include a component area AR1, an adjacent area AR2, a main area AR3, and a peripheral area AR4. The pixel PX may be arranged in the component area AR1, the adjacent area AR2, and the main area AR3. Accordingly, the component area AR1, the adjacent area AR2, and the main area AR3 may be a display area. The pixel PX may be omitted from the peripheral area AR4, and the peripheral area AR4 may be a non-display area.

The component area AR1 may be an area that overlaps a component and may also be an area where the pixels PX are arranged. The first pixel PX1 may be arranged in the component area AR1. In one or more embodiments, the first pixels PX1 may be arranged in the component area AR1. Accordingly, the display apparatus 1 may overlap a component in the component area AR1, and may display an image.

As the component area AR1 may be an area that overlaps a component, the display apparatus 1 may have relatively high transmittance of light or sound in the component area AR1. For example, the optical transmittance of the component area AR1 of the display apparatus 1 may be about 10% or more, about 25% or more, about 40% or more, about 50% or more, about 85% or more, or about 90% or more. In one or more embodiments, the transmittance of light or sound of the display apparatus 1 in the component area AR1 may be greater than or equal to transmittance of light or sound of the display apparatus 1 in the adjacent area AR2 and the main area AR3.

The display apparatus 1 may include at least one component area AR1. For example, the display apparatus 1 may include one component area AR1 or a plurality of component areas AR1.

Although FIG. 1 illustrates that the component area AR1 has a rectangular shape, in one or more other embodiments, the component area AR1 may have various shapes, such as a circular shape, an oval shape, other polygonal shape (e.g., a star shape, a diamond shape), and the like. In the following description, a case in which the component area AR1 has a rectangular shape is mainly described in detail.

The adjacent area AR2 may at least partially surround the component area AR1. In one or more embodiments, the adjacent area AR2 may contact a boundary of the component area AR1. In one or more other embodiments, the adjacent area AR2 may be spaced apart from the component area AR1. In one or more embodiments, the adjacent area AR2 may include a first adjacent area AR2a and a second adjacent area AR2b. The first adjacent area AR2a and the second adjacent area AR2b may be arranged in a first direction, for example, in a +x direction, with the component area AR1 therebetween.

The second pixel PX2 may be arranged in the adjacent area AR2. In one or more embodiments, the second pixels PX2 may be arranged in the adjacent area AR2. Accordingly, in the adjacent area AR2, the display apparatus 1 may display an image.

Although FIG. 1 illustrates that the component area AR1 and the adjacent area AR2 are arranged in an upper side in the display apparatus 1, in one or more other embodiments, the component area AR1 and the adjacent area AR2 may be arranged in the lower, right, and/or left side of the display apparatus 1.

The main area AR3 may at least partially surround the adjacent area AR2. In one or more embodiments, the main area AR3 may at least partially surround the component area AR1 and the adjacent area AR2. For example, the main area AR3 may surround only parts of the component area AR1 and the adjacent area AR2. In another example, the main area AR3 may entirely surround the component area AR1 and the adjacent area AR2. In one or more embodiments, the resolution of the display apparatus 1 in the main area AR3 may be greater than or equal to the resolution of the display apparatus 1 in the component area AR1. The resolution of the display apparatus 1 in the main area AR3 may be greater than or equal to the resolution of the display apparatus 1 in the adjacent area AR2.

The peripheral area AR4 may at least partially surround the component area AR1. In one or more embodiments, the peripheral area AR4 may entirely surround the component area AR1. In one or more embodiments, the peripheral area AR4 may entirely surround the component area AR1, the adjacent area AR2, and the main area AR3.

Figure 2:
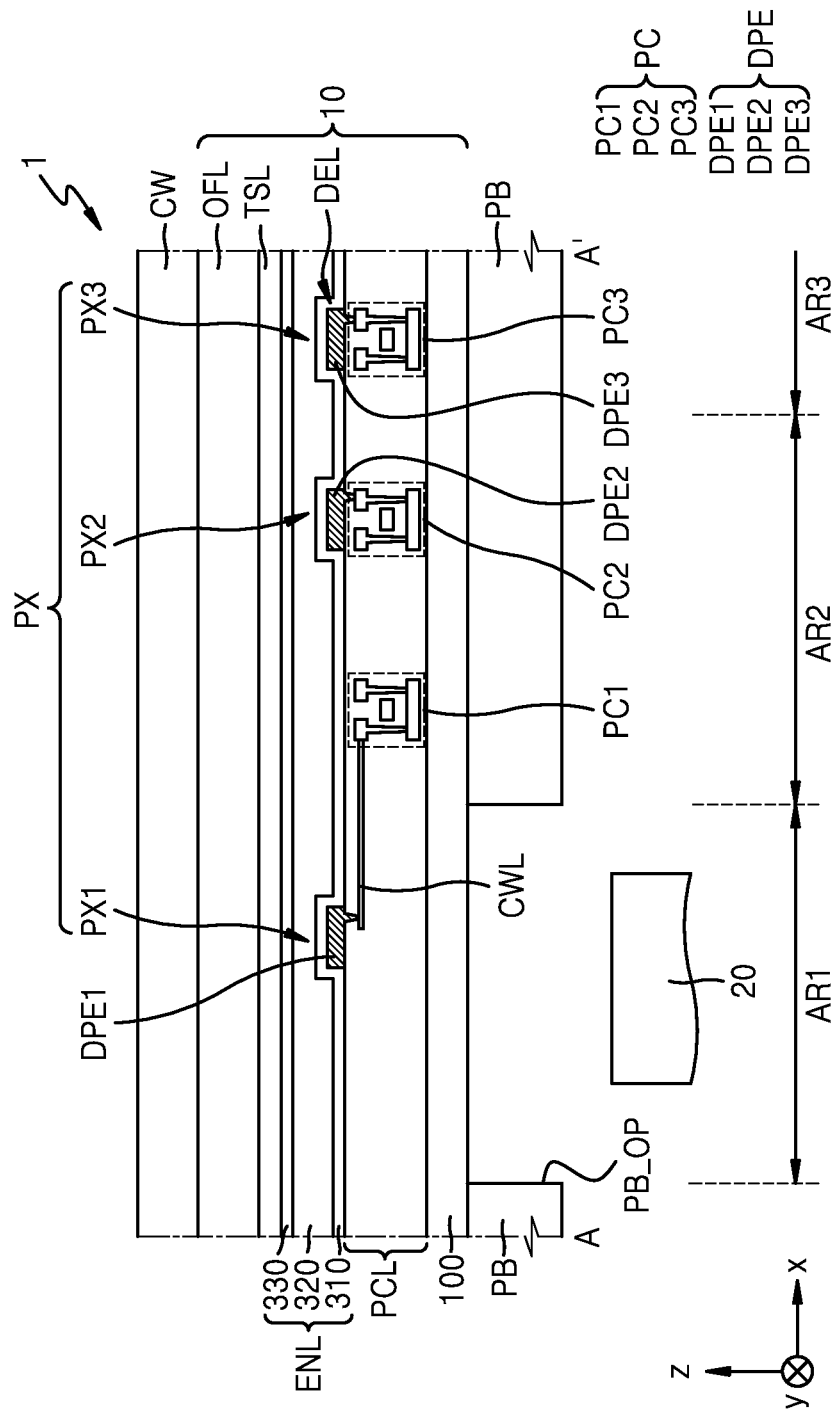
FIG. 2 is a cross-sectional view of the display apparatus of FIG. 1, taken along the line A-A'.

FIG. 2 is a cross-sectional view of the display apparatus of FIG. 1, taken along the line A-A'.

Referring to FIG. 2, the display apparatus 1 may include a display panel 10, a panel protection member PB, a component 20, and a cover window CW. The display panel 10 may include a substrate 100, a pixel circuit layer PCL including a pixel circuit PC, a display element layer DEL including a display element DPE, an encapsulation layer ENL, a touch sensor layer TSL, and an optical functional layer OFL.

The display apparatus 1 may include the component area AR1, the adjacent area AR2, and the main area AR3. In other words, the component area AR1, the adjacent area AR2, and the main area AR3 may be defined in the substrate 100 and a multilayer film in the substrate 100. For example, the substrate 100 may include the component area AR1, the adjacent area AR2, and the main area AR3. In the following description, a case in which the substrate 100 includes the component area AR1, the adjacent area AR2, and the main area AR3 is mainly described in detail.

The substrate 100 may include an insulating material, such as glass, quartz, polymer resin, and the like. The substrate 100 may be a rigid substrate or a flexible substrate capable of bending, folding, rolling, and the like.

The pixel circuit layer PCL may be located on the substrate 100. The pixel circuit layer PCL may include the pixel circuit PC, a connection wiring CWL, and an insulating layer. The pixel circuit PC may include at least one thin film transistor. The pixel circuit PC may include a plurality of pixel circuits PC. The pixel circuits PC may be arranged in at least one of the adjacent area AR2 and the main area AR3. For example, a first pixel circuit PC1 and a second pixel circuit PC2 may be arranged in the adjacent area AR2, and a third pixel circuit PC3 may be arranged in the main area AR3. The pixel circuit PC may be omitted from the component area AR1. Accordingly, the transmittance, for example, light transmittance, of the display panel 10 in the component area AR1 may be greater than the transmittance, for example, light transmittance, of the display panel 10 in the adjacent area AR2 and the main area AR3.

In one or more embodiments, the connection wiring CWL may be electrically connected to the first pixel circuit PC1 arranged in the adjacent area AR2. In one or more embodiments, the connection wiring CWL may include a metal material forming the pixel circuit PC. For example, the connection wiring CWL may include the same material as a gate electrode, and a source-drain electrode that form a thin film transistor, or a connection electrode. In one or more embodiments, the connection wiring CWL may include a transparent conducting oxide. For example, the connection wiring CWL may include a conductive oxide, such as an indium tin oxide (ITO), an indium zinc oxide (IZO), an oxide zinc (ZnO), an indium oxide ($In_2O_3$), an indium gallium oxide (IGO), and/or an aluminum zinc oxide (AZO).

The display element layer DEL may include the display element DPE and may be located on the pixel circuit layer PCL. In one or more embodiments, the display element DPE may implement the pixel PX by emitting light. In one or more embodiments, the display element DPE may be an organic light-emitting diode including an organic emission layer. Alternatively, the display element DPE may be a light-emitting diode LED. The size of the light-emitting diode LED may be in a micro scale or a nano scale. For example, the light-emitting diode LED may be a micro light-emitting diode. Alternatively, the light-emitting diode LED may be a nanorod light-emitting diode. The nanorod light-emitting diode may include a gallium nitride (GaN). In one or more embodiments, a color conversion layer may be located on the nanorod light-emitting diode. The color conversion layer may include quantum dots. Alternatively, the display element DPE may be a quantum-dot light-emitting diode including a quantum-dot emission layer. Alternatively, the display element DPE may be an inorganic light-emitting diode including an inorganic semiconductor. In the following description, a case in which the display element DPE is an organic light-emitting diode is mainly described in detail.

The display element DPE may include a plurality of display elements DPE. The display elements DPE may be arranged in the component area AR1, the adjacent area AR2, and the main area AR3. The display elements DPE may include a first display element DPE1 arranged in the component area AR1, a second display element DPE2 arranged in the adjacent area AR2, and a third display element DPE3 arranged in the main area AR3. The first display element DPE1 may implement the first pixel PX1 by emitting light. The second display element DPE2 may implement the second pixel PX2 by emitting light. The third display element DPE3 may implement the third pixel PX3 by emitting light. Accordingly, the display apparatus 1 may display an image in the component area AR1, the adjacent area AR2, and the main area AR3.

The display element DPE may be electrically connected to the pixel circuit PC. The first display element DPE1 may be electrically connected to the first pixel circuit PC1 arranged in the adjacent area AR2. In one or more embodiments, the first display element DPE1 may be electrically connected to the first pixel circuit PC1 arranged in the adjacent area AR2 through the connection wiring CWL. The second display element DPE2 may be electrically connected to the second pixel circuit PC2 arranged in the adjacent area AR2. The third display element DPE3 may be electrically connected to the third pixel circuit PC3 arranged in the main area AR3.

The encapsulation layer ENL may be located on the display element layer DEL. The encapsulation layer ENL may cover the display element DPE. In one or more embodiments, the encapsulation layer ENL may include at least one inorganic encapsulation layer and at least one organic encapsulation layer. At least one inorganic encapsulation layer may include one or more inorganic materials of an aluminum oxide ($Al_2O_3$), a titanium oxide ($TiO_2$), a tantalum oxide ($Ta_2O_5$), a zinc oxide ($ZnO_x$), a silicon oxide ($SiO_2$), a silicon nitride ($SiN_x$), and a silicon oxynitride (SiON). $ZnO_x$ may be ZnO and/or peroxide zinc ($ZnO_2$). At least one organic encapsulation layer may include a polymer-based material. The polymer-based material may include acrylic-based resin, epoxy-based resin, polyimide, polyethylene, and the like. In one or more embodiments, at least one organic encapsulation layer may include acrylate.

In one or more embodiments, the encapsulation layer ENL may include a first inorganic encapsulation layer 310, an organic encapsulation layer 320, and a second inorganic encapsulation layer 330, which are sequentially stacked. The first inorganic encapsulation layer 310 and the second inorganic encapsulation layer 330 may prevent or reduce the organic encapsulation layer 320 and/or the display element DPE from being exposed to a foreign material, such as moisture and the like.

In one or more other embodiments, the encapsulation layer ENL may have a structure in which the substrate 100 and an upper substrate that is a transparent member are coupled to each other by a sealing member so that an inner space between the substrate 100 and the upper substrate is hermetically sealed. In this state, a moisture absorbing material, a filler, and the like may be located in the inner space. The sealing member may be a sealant, and in one or more other embodiments, the sealing member may include a material that is cured by laser. For example, the sealing member may be frit. In detail, the sealing member may include an organic sealant, such as urethane-based resin, epoxy-based resin, or acrylic-based resin, or an inorganic sealant. In one or more embodiments, the sealing member may include silicone. The urethane-based resin may include, for example, urethane acrylate and the like. The acrylic-based resin may include, for example, butyl acrylate, ethylhexyl acrylate, and the like. The sealing member may include a material that is cured by heat.

The touch sensor layer TSL may obtain coordinates information according to an external input, for example, a touch event. The touch sensor layer TSL may include a touch electrode and a touch wiring connected to the touch electrode. The touch sensor layer TSL may sense an external input by a self-capacitance method or a mutual capacitance method.

The touch sensor layer TSL may be located on (e.g., above) the encapsulation layer ENL. In one or more embodiments, the touch sensor layer TSL may be located directly on the encapsulation layer ENL. In this case, an adhesive layer, such as an optically clear adhesive layer, might not be provided between the touch sensor layer TSL and the encapsulation layer ENL. In one or more other embodiments, after separately formed on a touch substrate, the touch sensor layer TSL may be coupled to the encapsulation layer ENL through an adhesive layer, such as an optically clear adhesive layer.

The optical functional layer OFL may include an antireflective layer. The antireflective layer may reduce the reflectivity of light, for example, external light, that is externally input toward the display apparatus 1. In some embodiments, the optical functional layer OFL may be a polarization film. In some embodiments, the optical functional layer OFL may be provided as a filter plate including a black matrix and color filters.

The cover window CW may be located on the display panel 10. The cover window CW may protect the display panel 10. The cover window CW may include at least one of glass, sapphire, or plastic. The cover window CW may be, for example, ultrathin glass or colorless polyimide.

The panel protection member PB may be located below the substrate 100. The panel protection member PB may support and protect the substrate 100. In one or more embodiments, the panel protection member PB may have (e.g., define) an opening PB_OP that overlaps the component area AR1. In one or more other embodiments, the opening PB_OP of the panel protection member PB may overlap the component area AR1 and the adjacent area AR2. In one or more embodiments, the panel protection member PB may include polyethylene terephthalate or polyimide.

The component 20 may be located below the display panel 10. In one or more embodiments, the display panel 10 may be located between the cover window CW and the component 20. In one or more embodiments, the component 20 may overlap the component area AR1.

The component 20 may include an imaging device as a camera using infrared, visible light, or the like. Alternatively, the component 20 may be a solar cell, a flash, an illuminance sensor, a proximity sensor, or an iris sensor. Alternatively, the component 20 may have a function of receiving sound. To reduce a limitation of the function of the component 20, the first pixel circuit PC1 for driving the first display element DPE1 may be arranged in the adjacent area AR2, as opposed to in the component area AR1. Accordingly, the transmittance of the display panel 10 in the component area AR1 may be greater than the transmittance of the display panel 10 in the adjacent area AR2.

Figure 3:
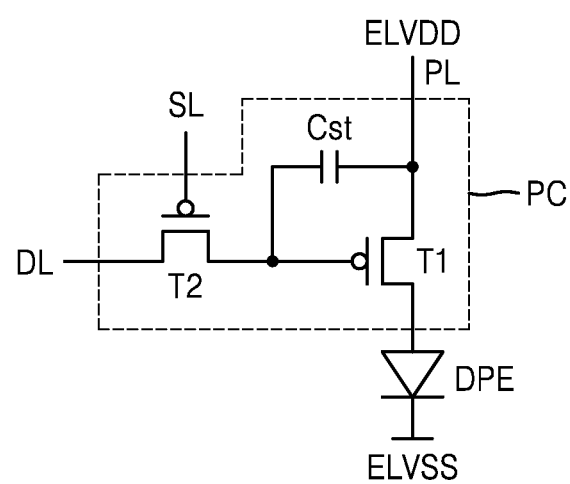
FIG. 3 is an equivalent circuit diagram of a pixel that may be included in a display apparatus according to one or more embodiments.

FIG. 3 is an equivalent circuit diagram of a pixel that may be included in a display apparatus according to one or more embodiments.

Referring to FIG. 3, the pixel circuit PC may include a driving thin film transistor T1, a switching thin film transistor T2, and a storage capacitor Cst.

The switching thin film transistor T2 is electrically connected to each of a scan line SL and a data line DL, and may transmit a data signal or a data voltage received through the data line DL to the driving thin film transistor T1 in response to a scan signal or a switching voltage received through the scan line SL. The storage capacitor Cst is electrically connected to the switching thin film transistor T2 and a driving voltage line PL, and may store a voltage corresponding to a difference between a voltage received from the switching thin film transistor T2 and a driving voltage ELVDD supplied through the driving voltage line PL.

The driving thin film transistor T1 is electrically connected to each of the driving voltage line PL and the storage capacitor Cst, and may control a driving current flowing from the driving voltage line PL to the display element DPE in response to a voltage value stored in the storage capacitor Cst. The display element DPE may emit light having a certain luminance according to the driving current. A counter electrode of the display element DPE may receive a common voltage ELVSS.

Although FIG. 3 illustrates that the pixel circuit PC includes two thin film transistors and one storage capacitor, the pixel circuit PC may include three or more thin film transistors.

Figure 4:
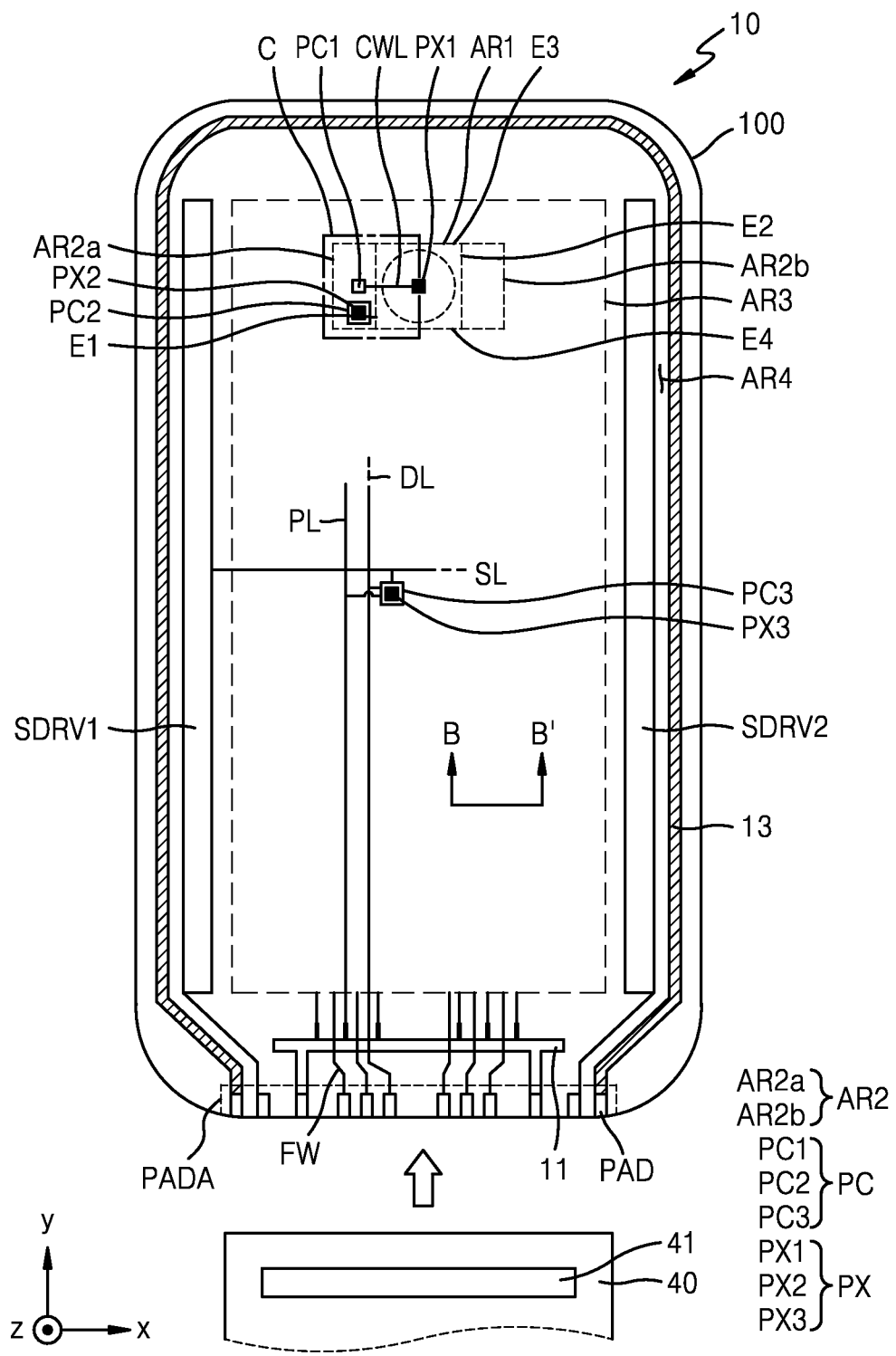
FIG. 4 is a schematic plan view of a display panel according to one or more embodiments.

FIG. 4 is a schematic plan view of a display panel according to one or more embodiments.

Referring to FIG. 4, the display panel 10 may include the substrate 100, the pixel circuit PC, and the pixel PX. In one or more embodiments, the substrate 100 may include the component area AR1, the adjacent area AR2, the main area AR3, and the peripheral area AR4. In one or more embodiments, the adjacent area AR2 may at least partially surround the component area AR1. For example, the adjacent area AR2 may include the first adjacent area AR2a and the second adjacent area AR2b. The first adjacent area AR2a may be arranged in contact with a first boundary E1 of the component area AR1, and the second adjacent area AR2b may be arranged in contact with a second boundary E2 of the component area AR1, the second boundary E2 facing, or being opposite to, the first boundary E1. In one or more embodiments, the component area AR1 may have a polygonal shape that overlaps a component. For example, the component area AR1 may have a rectangular shape that has four boundaries. In one or more embodiments, the first adjacent area AR2a and the second adjacent area AR2b may be arranged in the first direction, for example, the x direction, with the component area AR1 therebetween.

The main area AR3 may at least partially surround the component area AR1 and the adjacent area AR2. In one or more embodiments, the main area AR3 may be arranged in contact with a third boundary E3 of the component area AR1 and a fourth boundary E4 of the component area AR1, the fourth boundary E4 facing, or being opposite to, the third boundary E3. The peripheral area AR4 may at least partially surround the main area AR3. In one or more embodiments, the peripheral area AR4 may at least partially surround the component area AR1, the adjacent area AR2, and the main area AR3.

The pixel circuit PC may not be arranged in the component area AR1. The pixel circuit PC may be arranged in the adjacent area AR2 and/or the main area AR3. In some embodiments, the pixel circuit PC may be arranged in the peripheral area AR4. The pixel circuit PC may include the first pixel circuit PC1, the second pixel circuit PC2, and the third pixel circuit PC3. The first pixel circuit PC1 and the second pixel circuit PC2 may be arranged in the adjacent area AR2. The third pixel circuit PC3 may be arranged in the main area AR3. Accordingly, the transmittance of the display panel 10 of sound or light in the component area AR1 may be greater than the transmittance of the display panel 10 of sound or light in the adjacent area AR2 and the main area AR3.

The pixel PX may be implemented by a display element, such as an organic light-emitting diode. The pixel PX may include the first pixel PX1, the second pixel PX2, and the third pixel PX3. The first pixel PX1 may be arranged in the component area AR1, and may be electrically connected to the first pixel circuit PC1 arranged in the adjacent area AR2.

The second pixel PX2 may be arranged in the adjacent area AR2, and may be electrically connected to the second pixel circuit PC2 arranged in the adjacent area AR2. The second pixel PX2 may be provided adjacent to, or to overlap, the second pixel circuit PC2. The third pixel PX3 may be arranged in the main area AR3, and may be electrically connected to the third pixel circuit PC3 arranged in the main area AR3. In one or more embodiments, the third pixel PX3 may be provided adjacent to or to overlap the third pixel circuit PC3.

The pixel PX may include a plurality of pixels PX, and the pixels PX may display an image by emitting light. In one or more embodiments, each of the first pixel PX1, the second pixel PX2, and the third pixel PX3 may include a plurality of pixels. The first pixels PX1, the second pixels PX2, and a plurality of third pixels PX3 may display one image, or may respectively display independent images. In one or more embodiments, one pixel PX may include a plurality of display elements.

In one or more embodiments, the resolution of the display panel 10 in the component area AR1 and the adjacent area AR2 may be less than or equal to the resolution of the display panel 10 in the main area AR3. For example, the resolution of the display panel 10 in the component area AR1 and the adjacent area AR2 may be about 1/1, about 1/2, about 3/8, about 1/3, about 1/4, about 2/9, about 1/8, about 1/9, about 1/16, or the like of the resolution of the display panel 10 in the main area AR3.

The peripheral area AR4 may be a non-display area where the pixel PX is not arranged. In one or more embodiments, the display panel 10 may further include a first scan driving circuit SDRV1, a second scan driving circuit SDRV2, a pad PAD, a driving voltage supply line 11, and a common voltage supply line 13, which are arranged in the peripheral area AR4.

Any one of the first scan driving circuit SDRV1 and the second scan driving circuit SDRV2 may apply a scan signal to the pixel circuit PC through the scan line SL. In one or more embodiments, the main area AR3 may be located between the first scan driving circuit SDRV1 and the second scan driving circuit SDRV2. In one or more embodiments, any one of the pixels PX may receive a scan signal from the first scan driving circuit SDRV1, and another of the pixels PX may receive a scan signal from the second scan driving circuit SDRV2.

The pad PAD may be arranged in a pad area PADA that is one side of the peripheral area AR4. The pad PAD may be exposed without being covered by an insulating layer and may be electrically connected to a display circuit board 40. A display driving portion 41 may be located on the display circuit board 40. The display driving portion 41 may generate a signal that is transmitted to the first scan driving circuit SDRV1 and the second scan driving circuit SDRV2. The display driving portion 41 may generate a data signal, and the generated data signal may be transmitted to the pixel circuit PC through a fan-out wiring FW and the data line DL connected to the fan-out wiring FW.

The display driving portion 41 may supply a driving voltage ELVDD (see FIG. 3) through the driving voltage supply line 11, and a common voltage ELVSS (see FIG. 3) through the common voltage supply line 13. The driving voltage ELVDD may be supplied to the pixel circuit PC through the driving voltage line PL that is electrically connected to the driving voltage supply line 11, and the common voltage ELVSS may be supplied to a counter electrode of a display element that is electrically connected to the common voltage supply line 13.

Figure 5:
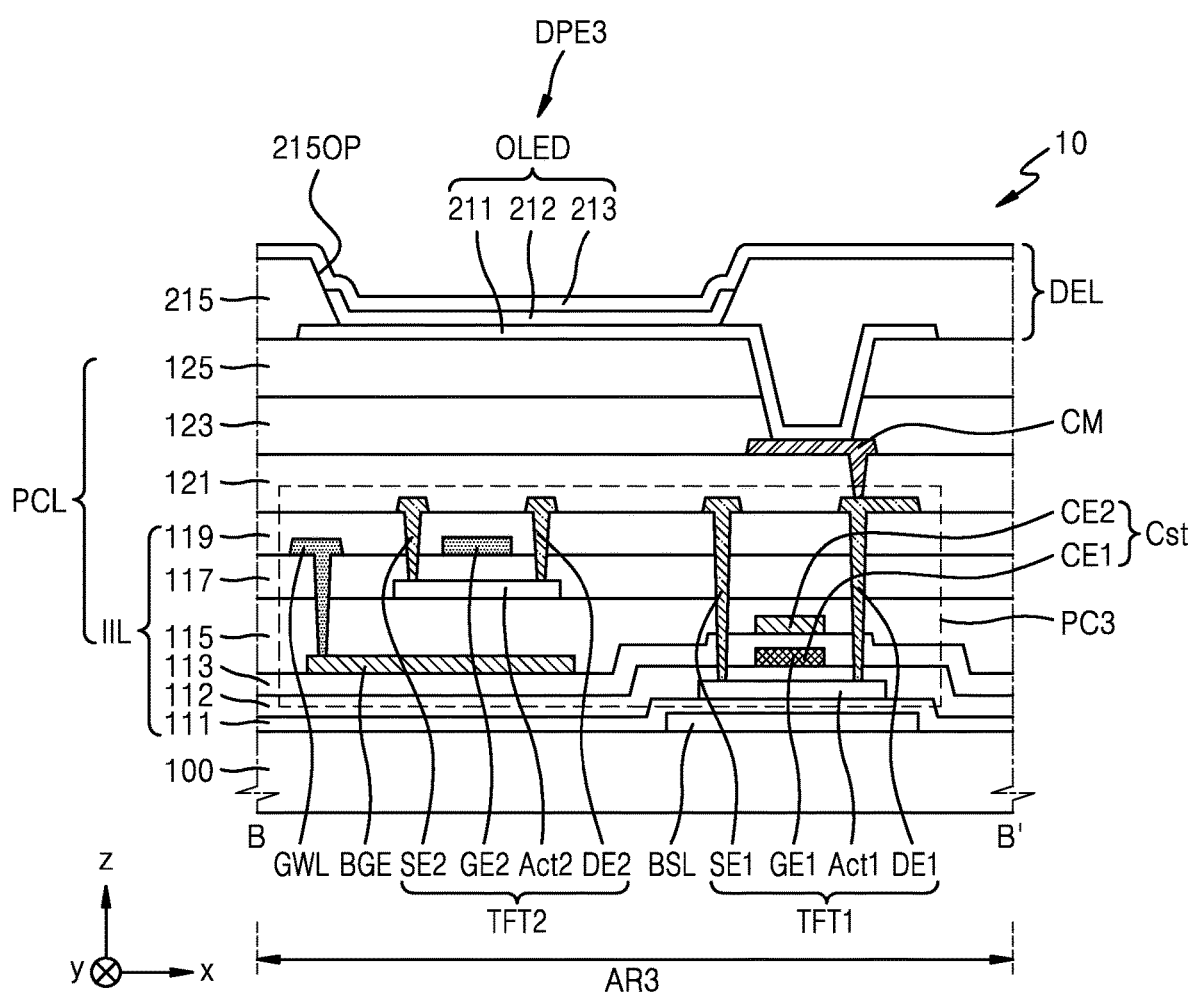
FIG. 5 is a cross-sectional view of the display panel of FIG. 4, taken along the line B-B'.

FIG. 5 is a cross-sectional view of the display panel 10 of FIG. 4, taken along the line B-B'.

Referring to FIG. 5, the display panel 10 may include the substrate 100, the pixel circuit layer PCL, and the display element layer DEL. In one or more embodiments, the substrate 100 may include the main area AR3. The substrate 100 may include glass or polymer resin, such as polyethersulfone, polyarylate, polyetherimide, polyethylene naphthalate, polyethylene terephthalate, polyphenylene sulfide, polyimide, polycarbonate, cellulose triacetate, cellulose acetate propionate, and the like. In one or more embodiments, the substrate 100 may have a multilayer structure including a base layer including the polymer resin described above, and a barrier layer. The substrate 100 including polymer resin may be flexible, rollable, or bendable.

The pixel circuit layer PCL may be located on the substrate 100. The pixel circuit layer PCL may include the third pixel circuit PC3, an inorganic insulating layer IIL, a first organic insulating layer 121, a second organic insulating layer 123, and a connection electrode CM. In one or more embodiments, the pixel circuit layer PCL may further include a third organic insulating layer 125 that is arranged between the second organic insulating layer 123 and the display element layer DEL. In one or more embodiments, the inorganic insulating layer IIL may include a buffer layer 111, a first gate insulating layer 112, a first inorganic insulating layer 113, a second inorganic insulating layer 115, a second gate insulating layer 117, and an interlayer insulating layer 119.

The third pixel circuit PC3 may be arranged in the main area AR3. The third pixel circuit PC3 may include a first thin film transistor TFT1, a second thin film transistor TFT2, and the storage capacitor Cst. The first thin film transistor TFT1 may include a first semiconductor layer Act1, a first gate electrode GE1, a first source electrode SE1, and a first drain electrode DE1. The second thin film transistor TFT2 may include a second semiconductor layer Act2, a second gate electrode GE2, a second source electrode SE2, and a second drain electrode DE2. The storage capacitor Cst may include a lower electrode CE1 and an upper electrode CE2 (e.g., an upper electrode of the first thin film transistor TFT1). In one or more embodiments, some of the first source electrode SE1, the first drain electrode DE1, the second source electrode SE2, and the second drain electrode DE2 may be omitted or replaced with other elements.

The buffer layer 111 may be located on the substrate 100. The buffer layer 111 may include an inorganic insulating material, such as $SiN_x$, SiON, and $SiO_2$, and may be a single layer or multilayer including the inorganic insulating material described above.

The first semiconductor layer Act1 may include a silicon semiconductor. The first semiconductor layer Act1 may include polysilicon. Alternatively, the first semiconductor layer Act1 may include amorphous silicon. In some embodiments, the first semiconductor layer Act1 may include an oxide semiconductor, or an organic semiconductor and the like. The first semiconductor layer Act1 may include a channel region and a drain region and a source region that are arranged at both sides of the channel region. The first gate electrode GE1 may overlap the channel region.

The first gate electrode GE1 may overlap the first semiconductor layer Act1. The first gate electrode GE1 may include a low-resistance metal material. The first gate electrode GE1 may include a conductive material including molybdenum (Mo), aluminum (Al), copper (Cu), titanium (Ti), and the like, and may be provided in a multilayer or single layer including the material.

The first gate insulating layer 112 may be located between the first semiconductor layer Act1 and the first gate electrode GE1. Accordingly, the first semiconductor layer Act1 may be insulated from the first gate electrode GE1. The first gate insulating layer 112 may include an inorganic insulating material, such as $SiO_2$, $SiN_x$, SiON, $Al_2O_3$, $TiO_2$, a tantalum oxide ($Ta_2O_5$), a hafnium oxide ($HfO_2$), $ZnO_x$, and/or the like. In one or more embodiments, $ZnO_x$ may be ZnO and/or $ZnO_2$.

The first inorganic insulating layer 113 may cover the first gate electrode GE1. For example, the first inorganic insulating layer 113 may be located on the first gate electrode GE1. The first inorganic insulating layer 113, similarly to the first gate insulating layer 112, may include an inorganic insulating material, such as $SiO_2$, $SiN_x$, SiON, $Al_2O_3$, $TiO_2$, $Ta_2O_5$, $HfO_2$, $ZnO_x$, and/or the like.

The upper electrode CE2 may be located on the first inorganic insulating layer 113. The upper electrode CE2 may overlap the first gate electrode GE1 thereunder. In this case, the upper electrode CE2 and the first gate electrode GE1 overlapping each other may form the storage capacitor Cst together with the first inorganic insulating layer 113 therebetween. In other words, the first gate electrode GE1 of the first thin film transistor TFT1 may function as the lower electrode CE1 of the storage capacitor Cst. As such, the storage capacitor Cst and the first thin film transistor TFT1 may overlap each other. In some embodiments, the storage capacitor Cst may not overlap the first thin film transistor TFT1. The upper electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be a single layer or multilayer including the material described above.

The second inorganic insulating layer 115 may cover the upper electrode CE2. In one or more embodiments, the second inorganic insulating layer 115 may cover the first gate electrode GE1. The second inorganic insulating layer 115 may include $SiO_2$, $SiN_x$, SiON, $Al_2O_3$, $TiO_2$, $Ta_2O_5$, $HfO_2$, $ZnO_x$, and/or the like. The second inorganic insulating layer 115 may be may be a single layer or multilayer including the inorganic insulating material described above.

The second semiconductor layer Act2 may be located on the second inorganic insulating layer 115. In one or more embodiments, the second semiconductor layer Act2 may include a channel region, and a source region and a drain region arranged at respective sides of the channel region. The second semiconductor layer Act2 may include an oxide semiconductor. For example, the second semiconductor layer Act2 may include a Zn oxide-based material, for example, a Zn oxide, an In—Zn oxide, a Ga—In—Zn oxide, and the like. Alternatively, the second semiconductor layer Act2 may include an In—Ga—Zn—O (IGZO), In—Sn—Zn—O (ITZO), or In—Ga—Sn—Zn—O (IGTZO) semiconductor that contains a metal, such as indium (In), gallium (Ga), or tin (Sn) in ZnO.

The source region and the drain region of the second semiconductor layer Act2 may be made conductive by adjusting the carrier concentration of an oxide semiconductor. For example, the source region and the drain region of the second semiconductor layer Act2 may be formed by increasing the carrier concentration of an oxide semiconductor through a plasma process on the oxide semiconductor using a hydrogen-based gas, a fluorine-based gas, or a combination thereof.

The second gate insulating layer 117 may cover the second semiconductor layer Act2. The second gate insulating layer 117 may be located between the second semiconductor layer Act2 and the second gate electrode GE2. In one or more embodiments, the second gate insulating layer 117 may be located entirely on the substrate 100. In one or more other embodiments, the second gate insulating layer 117 may be patterned according to the shape of the second gate electrode GE2. The second gate insulating layer 117 may include $SiO_2$, $SiN_x$, SiON, $Al_2O_3$, $TiO_2$, $Ta_2O_5$, $HfO_2$, $ZnO_x$, and/or the like. The second gate insulating layer 117 may be a single layer or multilayer including inorganic insulating material described above.

The second gate electrode GE2 may be located on the second gate insulating layer 117. The second gate electrode GE2 may overlap the second semiconductor layer Act2. The second gate electrode GE2 may overlap the channel region of the second semiconductor layer Act2. The second gate electrode GE2 may include a conductive material including Mo, Al, Cu, Ti, and the like, and may be a multilayer or single layer including the above material.

The interlayer insulating layer 119 may cover the second gate electrode GE2. The interlayer insulating layer 119 may include $SiO_2$, $SiN_x$, SiON, $Al_2O_3$, $TiO_2$, $Ta_2O_5$, $HfO_2$, $ZnO_x$, and/or the like. The interlayer insulating layer 119 may be a single layer or multilayer including the inorganic insulating material described above.

The first source electrode SE1 and the first drain electrode DE1 may be located on the interlayer insulating layer 119. The first source electrode SE1 and the first drain electrode DE1 may be electrically connected to the first semiconductor layer Act1. The first source electrode SE1 and the first drain electrode DE1 may be electrically connected to the first semiconductor layer Act1 through contact holes of insulating layers (e.g., insulating layers 112, 113, 115, 117 and 119).

The second source electrode SE2 and the second drain electrode DE2 may be located on the interlayer insulating layer 119. The second source electrode SE2 and the second drain electrode DE2 may be electrically connected to the second semiconductor layer Act2. The second source electrode SE2 and the second drain electrode DE2 may be electrically connected to the second semiconductor layer Act2 through the contact holes of insulating layers (e.g., insulating layers 117 and 119).

The first source electrode SE1, the first drain electrode DE1, the second source electrode SE2, and the second drain electrode DE2 may have a material having relatively excellent conductivity. The first source electrode SE1, the first drain electrode DE1, the second source electrode SE2, and the second drain electrode DE2 may include a conductive material including Mo, Al, Cu, Ti, and the like, and may be a multilayer or single layer including the above material. In one or more embodiments, the first source electrode SE1, the first drain electrode DE1, the second source electrode SE2, and the second drain electrode DE2 may have a multilayer structure of Ti/Al/Ti.

In one or more embodiments, some of the first source electrode SE1, the first drain electrode DE1, the second source electrode SE2, and the second drain electrode DE2 may be omitted or replaced with other elements. For example, a semiconductor layer of one thin film transistor is integrally provided with a semiconductor layer of an adjacent thin film transistor so as to share the source electrode and/or the drain electrode.

The first thin film transistor TFT1 including the first semiconductor layer Act1 including a silicon semiconductor may have high reliability. Accordingly, when the first thin film transistor TFT1 is employed as a driving thin film transistor, the display panel 10 of high quality may be implemented.

As an oxide semiconductor has relatively high carrier mobility and relatively low leakage current, even when a driving time is relatively long, a voltage drop may not be significant. In other words, as a color change of an image according to a voltage drop is not great even during relatively low frequency driving, low frequency driving is possible. As such, in the case of an oxide semiconductor, a low leakage current is an advantage, and thus, the oxide semiconductor is employed in at least one of thin film transistors other than the driving thin film transistor so that a leakage current may be prevented, and concurrently or substantially simultaneously consumption power may be reduced. For example, the second thin film transistor TFT2 may be employed as a switching thin film transistor.

A bottom gate electrode BGE may be located below the second semiconductor layer Act2. In one or more embodiments, the bottom gate electrode BGE may be located between the first inorganic insulating layer 113 and the second inorganic insulating layer 115. In one or more embodiments, the bottom gate electrode BGE may receive a gate signal. In this case, the second thin film transistor TFT2 may have a dual gate electrode structure in which gate electrodes are located above and below the second semiconductor layer Act2.

In one or more embodiments, a gate wiring GWL may be located between the second gate insulating layer 117 and the interlayer insulating layer 119. In one or more embodiments, the gate wiring GWL may be electrically connected to the bottom gate electrode BGE through contact holes provided in the second inorganic insulating layer 115 and the second gate insulating layer 117.

In one or more embodiments, a bottom shield layer BSL may be located between the substrate 100 and the pixel circuit PC. In one or more embodiments, the bottom shield layer BSL may overlap the first thin film transistor TFT1. A constant voltage may be applied to the bottom shield layer BSL. As the bottom shield layer BSL is located below the first thin film transistor TFT1, the first thin film transistor TFT1 is less affected by ambient interference signals so as to have improved reliability.

The bottom shield layer BSL may include a transparent conductive material. In one or more embodiments, the bottom shield layer BSL may include a transparent conducting oxide. For example, the bottom shield layer BSL may include a conductive oxide, such as ITO, IZO, ZnO, $In_2O_3$, IGO, or AZO.

The first organic insulating layer 121 may cover the first source electrode SE1, the first drain electrode DE1, the second source electrode SE2, and the second drain electrode DE2. The first organic insulating layer 121 may include an organic material. For example, the first organic insulating layer 121 may include an organic insulating material, such as general purpose polymers, such as polymethylmethacrylate (PMMA) or polystyrene (PS), polymer derivatives having a phenolic group, acrylic-based polymer, imide-based polymer, aryl ether-based polymer, amide-based polymer, fluorine-based polymer, p-xylene-based polymer, vinyl alcohol-based polymer, and a blend thereof.

The connection electrode CM may be located on the first organic insulating layer 121. In this state, the connection electrode CM may be electrically connected to the first drain electrode DE1 or the first source electrode SE1 through a contact hole of the first organic insulating layer 121. The connection electrode CM may include a material having excellent conductivity. The connection electrode CM may include a conductive material including Mo, Al, Cu, Ti, and the like, and may be a multilayer or single layer including the above material. In one or more embodiments, the connection electrode CM may have a multilayer structure of Ti/Al/Ti.

The second organic insulating layer 123 and the third organic insulating layer 125 may be provided to cover the connection electrode CM. The first organic insulating layer 121, the second organic insulating layer 123, and the third organic insulating layer 125 may include an organic material. For example, at least one of the first organic insulating layer 121, the second organic insulating layer 123, or the third organic insulating layer 125 may include an organic insulating material, such as general purpose polymers, such as PMMA or PS, polymer derivatives having a phenolic group, acrylic-based polymer, imide-based polymer, aryl ether-based polymer, amide-based polymer, fluorine-based polymer, p-xylene-based polymer, vinyl alcohol-based polymer, and a blend thereof.

The display element layer DEL may be located on the pixel circuit layer PCL. The display element layer DEL may include a display element. In one or more embodiments, the display element layer DEL may include an organic light-emitting diode OLED as a display element.

The organic light-emitting diode OLED may be electrically connected to the third pixel circuit PC3. The organic light-emitting diode OLED is electrically connected to the third pixel circuit PC3 arranged in the main area AR3 to implement the third display element DPE3. The organic light-emitting diode OLED may include a pixel electrode 211, an emission layer 212, and a counter electrode 213.

In one or more embodiments, the pixel electrode 211 may be located on the third organic insulating layer 125. The pixel electrode 211 may be electrically connected to the connection electrode CM through contact holes formed in the second organic insulating layer 123 and the third organic insulating layer 125.

The pixel electrode 211 may include a conductive oxide, such as ITO, IZO, ZnO, $In_2O_3$, IGO, or AZO. In one or more other embodiments, the pixel electrode 211 may include a reflective film including Ag, Mg, Al, Pt, Pd, Au, Ni, Nd, Ir, Cr, or a compound thereof. In one or more other embodiments, the pixel electrode 211 may further include a film formed of ITO, IZO, $ZnO_x$, or $In_2O_3$ above/below the reflective film described above.

A pixel defining layer 215 may include (e.g., define) an opening portion 215OP that exposes the central portion of the pixel electrode 211, and may be located on the pixel electrode 211. The opening portion 215OP may define an emission area of light emitted from the organic light-emitting diode OLED.

The pixel defining layer 215 may include an organic insulating material. In one or more other embodiments, the pixel defining layer 215 may include an inorganic insulating material, such as $SiN_x$, SiON, or $SiO_2$. In one or more other embodiments, the pixel defining layer 215 may include an organic insulating material and an inorganic insulating material. In some embodiments, the pixel defining layer 215 may include a light shield material, and may be provided in black. The light shield material may include resin or paste including carbon black, carbon nanotube, or black dye. The light shield material may include a metal particle, for example, nickel, aluminum, molybdenum and an alloy thereof, a metal oxide particle, for example, a chromium oxide, or a metal nitride particle, for example, a chromium nitride, and the like. When the pixel defining layer 215 includes a light shield material, external light reflection due to metal structures located below the pixel defining layer 215 may be reduced.

The emission layer 212 may be located on the pixel electrode 211. The emission layer 212 may overlap the opening portion 215OP. The emission layer 212 may include a low molecular weight or polymer material, and may emit red, green, blue, or white light.

In some embodiments, a hole injection layer (HIL) and/or a hole transport layer (HTL) may be located between the pixel electrode 211 and the emission layer 212. In one or more embodiments, the HTL may include poly(3,4-ethylenedioxythiophene) PEDOT, and the emission layer 212 may include a polymer material such as a polyphenylene vinylene (PPV)-based material, a polyfluorene-based material, and the like.

The counter electrode 213 may be located on the emission layer 212. The counter electrode 213 may include a conductive material having a low work function. For example, the counter electrode 213 may include a (semi-) transparent layer including Ag, Mg, Al, Pt, Pd, Au, Ni, Nd, Ir, Cr, lithium (Li), Ca, and/or an alloy thereof. Alternatively, the counter electrode 213 may further include a layer, such as ITO, IZO, ZnO or $In_2O_3$, on the (semi-) transparent layer including the material described above.

In some embodiments, an electron transport layer (ETL) and/or an electron injection layer (EIL) may be located between the emission layer 212 and the counter electrode 213.

Figure 6:
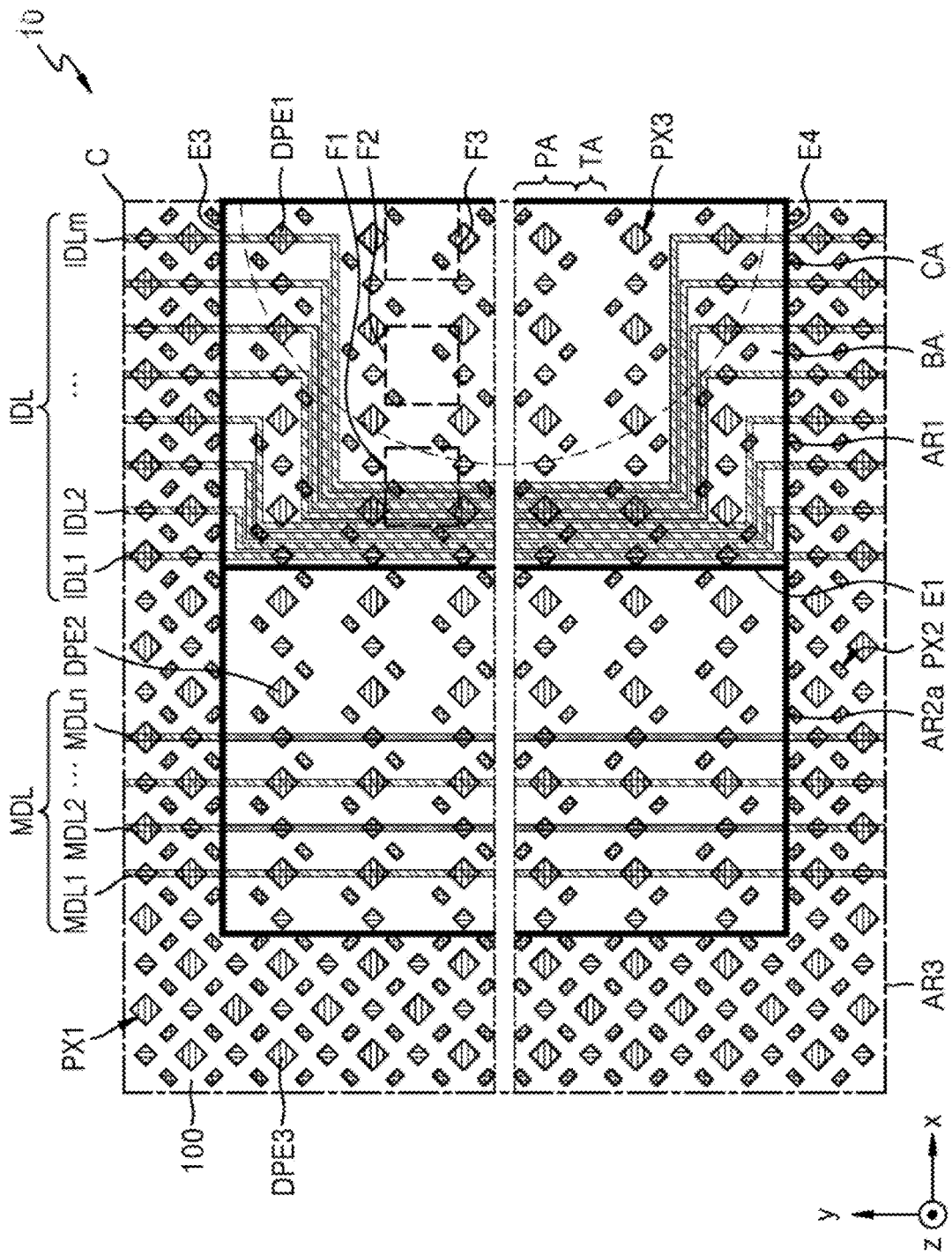
FIG. 6 is an enlarged view of a region C of the display panel of FIG. 4.

FIG. 6 is an enlarged view of a region C of the display panel of FIG. 4.

Referring to FIG. 6, the substrate 100 may include the component area AR1, the first adjacent area AR2a, the second adjacent area AR2b (see FIG. 4), and the main area AR3. The first adjacent area AR2a may be arranged in contact with the first boundary E1 of the component area AR1, and the second adjacent area AR2b may be arranged in contact with the second boundary E2 (see FIG. 4) of the component area AR1. For example, the first adjacent area AR2a, the component area AR1, and the second adjacent area AR2b may be sequentially arranged in the first direction, for example, the x direction. The main area AR3 may be arranged to surround at least part of each of the component area AR1, the first adjacent area AR2a, and the second adjacent area AR2b in plan view. For example, the main area AR3 may be arranged in contact with the component area AR1 at the third boundary E3 and the fourth boundary E4, where the component area AR1 is not in contact with the first adjacent area AR2a and the second adjacent area AR2b.

In one or more embodiments, the component area AR1, in which the first display element DPE1 is arranged, may include a plurality of pixel areas PA extending in the first direction, for example, the x direction, and a plurality of transmission areas TA arranged between the neighboring pixel areas PA. For example, the pixel electrodes of the first display element DPE1 may overlap the pixel area PA, and the transmission area TA may be defined as an area between the neighboring pixel areas PA in which the pixel electrodes of the first display element DPE1 are not arranged.

In one or more embodiments, the component area AR1 may include a boundary area BA including a first boundary area in contact with the first boundary E1, and a second boundary area in contact with the second boundary E2 (see FIG. 4), and a central area CA arranged between the two boundary areas BA. The transmittance of the central area CA may be greater than the transmittance of the boundary area BA. In one or more embodiments, the number of wirings arranged in the transmission area TA overlapping the central area CA may be less than the number of wirings arranged in the transmission area TA overlapping the boundary area BA.

The first adjacent area AR2a, in which the second display element DPE2 is arranged, may include a plurality of pixel areas PA extending in the first direction, for example, the x direction, and a plurality of transmission areas TA arranged between the neighboring pixel areas PA. For example, the pixel electrode and the emission layer of the second display element DPE2 may overlap the pixel area PA, and the transmission area TA may be defined as an area between the two neighboring pixel areas PA in which the pixel electrode and the emission layer of the second display element DPE2 are not arranged.

In one or more embodiments, the pixel areas PA of the component area AR1, of the first adjacent area AR2a, and of the second adjacent area AR2b may be arranged on a straight line in the first direction, for example, the x direction. Likewise, the transmission areas TA of the component area AR1, of the first adjacent area AR2a, and of the second adjacent area AR2b may be arranged on a straight line in the first direction, for example, the x direction.

The third display element DPE3 may be arranged in the main area AR3. The third display element DPE3 may be relatively densely arranged in the main area AR3. In one or more embodiments, the third display element DPE3 may be arranged with the transmission area TA of the component area AR1 on the same line in the first direction, for example, the x direction. Accordingly, the resolution of the display panel 10 in the main area AR3 may be greater than the resolution of the display panel 10 in the component area AR1 and/or the first adjacent area AR2a.

In one or more embodiments, the first display element DPE1 may include a plurality of first display elements DPE1 arranged in the pixel area PA of the component area AR1. In one or more embodiments, the first display element DPE1 may emit blue light, green light, or red light. In one or more other embodiments, the first display element DPE1 may emit blue light, green light, red light, or white light. One or more neighboring first display elements DPE1 may implement the first pixel PX1. For example, one first pixel PX1 may include the first display element DPE1 that emits blue light and the first display element DPE1 that emits green light. In another example, one first pixel PX1 may include the first display element DPE1 that emits red light and the first display element DPE1 that emits green light. In one or more embodiments, in a row of one pixel area PA extending in the first direction, for example, the x direction, the first pixel PX1 including the first display element DPE1 that emits blue light and the first display element DPE1 that emits green light, and the first pixel PX1 including the first display element DPE1 that emits red light and the first display element DPE1 that emits green light may be alternately arranged.

In one or more embodiments, the second display element DPE2 may include a plurality of second display elements, and the second display elements DPE2 may be arranged in the pixel area PA of the first adjacent area AR2a. In one or more embodiments, the second display element DPE2 may emit blue light, green light, or red light. In one or more other embodiments, the second display element DPE2 may emit blue light, green light, red light, or white light. One or more neighboring second display elements DPE2 may implement the second pixel PX2. For example, one second pixel PX2 may include the second display element DPE2 that emits blue light and the second display element DPE2 that emits green light. In another example, one second pixel PX2 may include the second display element DPE2 that emits red light and the second display element DPE2 that emits green light. In one or more embodiments, the arrangement of the second display element DPE2 in the first adjacent area AR2*a* and the second adjacent area AR2*b* may be the same as, or similar to, the arrangement of the first display element DPE1 in in the component area AR1.

In one or more embodiments, the third display element DPE3 may include a plurality of third display elements, and the third display elements DPE3 may be arranged in the main area AR3. In one or more embodiments, the third display element DPE3 may emit blue light, green light, or red light. In one or more other embodiments, the third display element DPE3 may emit blue light, green light, red light, or white light. One or more neighboring third display elements DPE3 may implement the third pixel PX3. The number of third pixels PX3 per unit area in the main area AR3 may be greater than the number of first pixels PX1 per unit area in the component area AR1 and may be greater than the number of second pixels PX2 per unit area in the first adjacent area AR2*a* and the second adjacent area AR2*b*. Accordingly, the resolution of the display panel 10 in the main area AR3 may be greater than the resolution of the display panel 10 in the component area AR1, in the first adjacent area AR2*a*, and in the second adjacent area AR2*b*.

In one or more embodiments, a plurality of connection data lines IDL may be arranged in the component area AR1. The connection data lines IDL are not electrically connected to the first display element DPE1, and may be a part of the data line DL (see FIG. 4) for transmitting a data signal or a data voltage to the third pixel circuit arranged in the main area AR3. The connection data lines IDL may be arranged adjacent to a closer one of the first boundary E1 and the second boundary E2. For example, the connection data lines IDL may be bent along the third boundary E3 and the fourth boundary E4 of the component area AR1, and may overlap the boundary area BA. Accordingly, the connection data lines IDL may overlap the central area CA to a relatively small degree.

In one or more embodiments, an adjacent data line MDL may be arranged in the first adjacent area AR2*a* and the second adjacent area AR2*b*. The adjacent data line MDL may be electrically connected to the first pixel circuit PC1 (see FIG. 4) or the second pixel circuit PC2 (see FIG. 4), and may transmit a data signal or a data voltage. In one or more embodiments, an adjacent data line MDL2 connected to the first pixel circuit PC1, and an adjacent data line MDL1 connected to the second pixel circuit PC2, may be alternately arranged. In one or more other embodiments, a group of adjacent data lines MDL connected to a plurality of first pixel circuits PC1, and a group of adjacent data lines MDL connected to a plurality of second pixel circuits PC2, may be alternately arranged. The adjacent data line MDL connected to the first pixel circuit PC1 may be integrated circuit (IC) mapped to drive the first display element DPE1 corresponding thereto.

Figure 7:
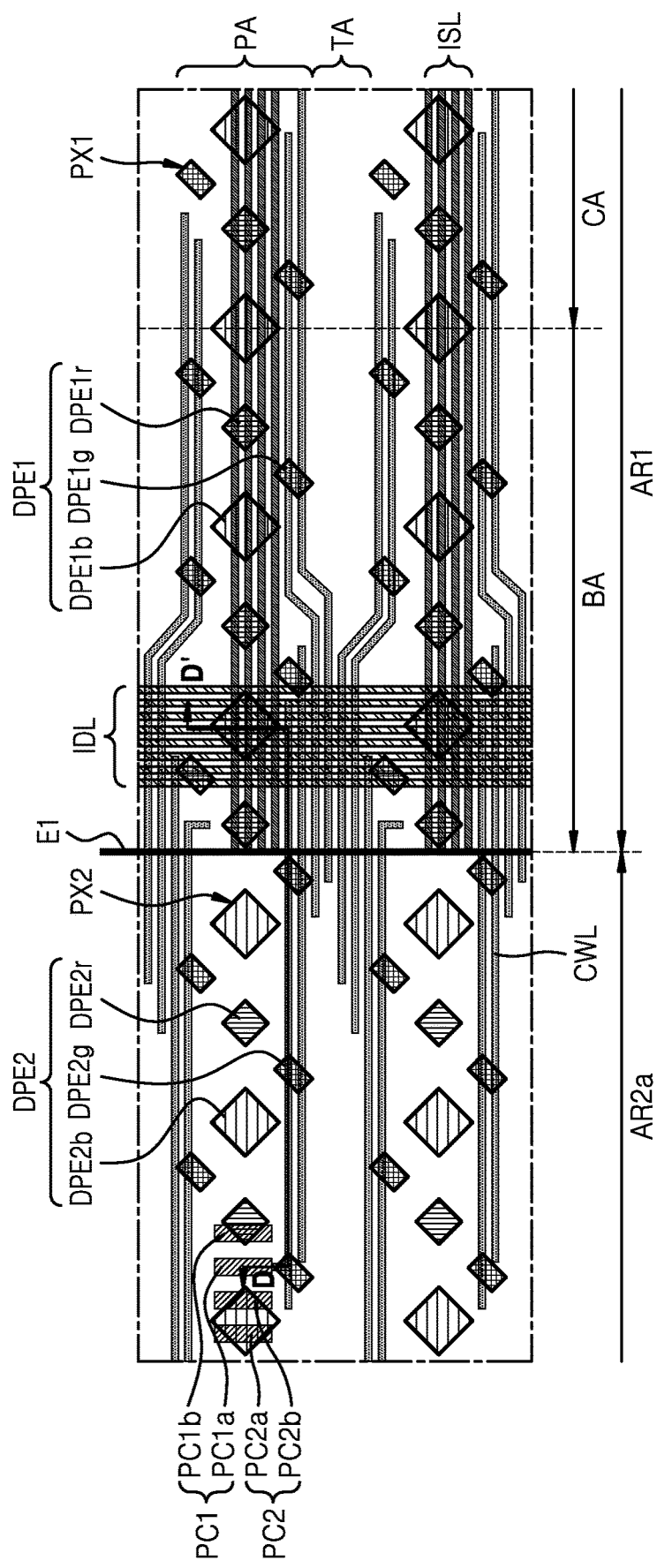
FIG. 7 is a schematic enlarged view of a boundary portion between an adjacent area and a component area in a display panel according to one or more embodiments.
Figure 8:
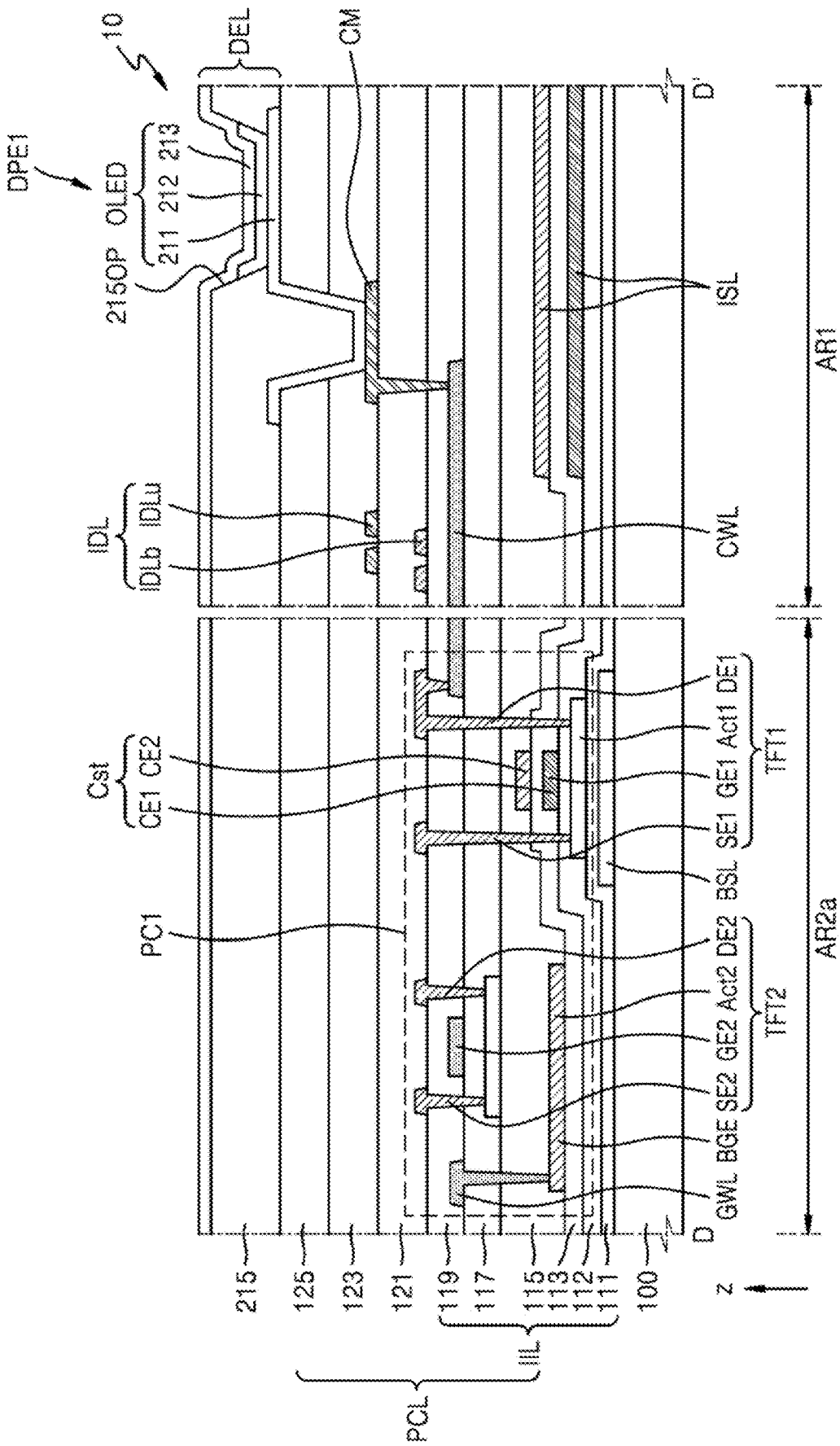
FIG. 8 is a cross-sectional view of the display panel of FIG. 7, taken along the line D-D'.

FIG. 7 is a schematic enlarged view of a boundary portion between an adjacent area and a component area in a display panel according to one or more embodiments, and FIG. 8 is a cross-sectional view of the display panel of FIG. 7, taken along the line D-D'.

Referring to FIG. 7, the first adjacent area AR2*a* may be arranged in contact with the first boundary E1 of the component area AR1. The component area AR1, in which the first pixel PX1 is arranged, may include the pixel areas PA extending in the first direction, for example, the x direction, and the transmission areas TA provided between the pixel areas PA. For example, the transmission area TA may be defined as an area that does not overlap the pixel electrodes and emission layer of the first display element DPE1 forming the first pixel PX1. The pixel areas PA and the transmission areas TA may be alternately arranged in a second direction, for example, a y direction.

The first adjacent area AR2*a*, in which the second pixel PX2 is arranged, may include the pixel areas PA extending in the first direction, for example, the x direction, and the transmission areas TA provided between the pixel areas PA. In one or more embodiments, the pixel area PA of the component area AR1 and the pixel area PA of the first adjacent area AR2*a* may be arranged on a straight line extending in the first direction, for example, the x direction. Likewise, the transmission area TA of the component area AR1 and the transmission area TA of the first adjacent area AR2*a* may be arranged on a straight line extending in the first direction, for example, the x direction.

The first display element DPE1 may be arranged in the pixel area PA of the component area AR1. In one or more embodiments, the first display element DPE1 may include a first blue display element DPE1*b*, a first green display element DPE1*g*, and a first red display element DPE1*r*. In one or more other embodiments, the first display element DPE1 may further include a white display element that emits white light. In one or more embodiments, the first pixel PX1 may include one or more first display elements DPE1. For example, one first pixel PX1 may include the first blue display element DPE1*b* and the first green display element DPE1*g*, and the other first pixel PX1 may include the first red display element DPE1*r* and the first green display element DPE1*g*. Alternatively, one first pixel PX1 may include the first blue display element DPE1*b*, the first green display element DPE1*g*, and the first red display element DPE1*r*. In one or more embodiments, the emission area of the first blue display element DPE1*b* may have an area that is greater than the emission area of the first red display element DPE1*r* and also greater than the emission area of the first green display element DPE1*g*.

The second display element DPE2, the first pixel circuit PC1, and the second pixel circuit PC2 may be arranged in the pixel area PA of the first adjacent area AR2*a*. In one or more embodiments, the second display element DPE2 may include a second blue display element DPE2*b*, a second green display element DPE2*g*, and a second red display element DPE2*r*. In one or more other embodiments, the second display element DPE2 may further include a white display element that emits white light. In one or more embodiments, the second pixel PX2 may include one or more second display elements DPE2.

The first pixel circuit PC1 may be electrically connected to the first display element DPE1 to drive the first display element DPE1. The first pixel circuit PC1 may be connected to the first display element DPE1 through the connection wiring CWL. The second pixel circuit PC2 may be electrically connected to the second display element DPE2 to drive the second display element DPE2. The second pixel circuit PC2 may overlap, or may be adjacent to, the second display element DPE2. In one or more embodiments, the first pixel circuit PC1 and the second pixel circuit PC2 may be alternately arranged. For example, one first pixel circuit PC1 and one second pixel circuit PC2 may be alternately arranged in the first direction, for example, the x direction. In one or more other embodiments, a plurality of first pixel circuits PC1 and a plurality of second pixel circuits PC2 may be alternately arranged in the first direction, for example, the x direction. In one or more other embodiments, a plurality of rows of the first pixel circuits PC1, and a plurality of rows of the second pixel circuits PC2 spaced apart from the plurality of rows of the first pixel circuits PC1 in the second direction (e.g., the y direction), may form a matrix in the pixel area PA. As such, the number and arrangement of the first pixel circuit PC1 and the second pixel circuit PC2 may be variously changed according to design.

The connection wiring CWL may be electrically connected to the first pixel circuit PC1 and the first display element DPE1. The connection wiring CWL may be electrically connected to the first display element DPE1 corresponding thereto and may be terminated. Accordingly, the number of connection wirings CWL may decrease from the first boundary E1 to the center of the component area AR1.

In the component area AR1, the connection wiring CWL may overlap the pixel area PA. For example, some portions of the connection wiring CWL may be arranged such that an area overlapping the pixel electrodes of the first display element DPE1 is relatively large or maximized. Accordingly, the connection wiring CWL is arranged such that an area overlapping the transmission area TA is relatively small or minimized, thereby improving the transmittance of the transmission area TA. In contrast, in the first adjacent area AR2a, the connection wiring CWL may overlap the edge of the pixel area PA and the transmission area TA. For example, the connection wiring CWL may be arranged such that an area overlapping the second display element DPE2, the first pixel circuit PC1, and the second pixel circuit PC2 is decreased. In one or more embodiments, the connection wiring CWL may be arranged along the edge of the pixel area PA at a boundary side of the boundary area BA adjacent to the first boundary E1. In one or more embodiments, the connection wiring CWL may overlap the transmission area TA at the first boundary E1. Accordingly, the transmittance of the transmission area TA in the boundary area BA may be less than the transmittance of the transmission area TA in the central area CA.

In one or more embodiments, the connection data lines IDL may overlap the boundary area BA of the component area AR1. The connection data lines IDL are not electrically connected to the first display element DPE1, and may be a part of the data line DL (see FIG. 4) for transmitting a data signal or a data voltage to the third pixel circuit PC3 (see FIG. 4) arranged in the main area AR3. The connection data lines IDL may be arranged adjacent to the first boundary E1.

In one or more embodiments, a signal wiring ISL may be arranged in the component area AR1. The signal wiring ISL may not be electrically connected to the first display element DPE1 arranged in the component area AR1, and may be a wiring for transmitting scan signals to the first pixel circuit PC1, the second pixel circuit PC2, and the third pixel circuit PC3. The signal wiring ISL may extend from the first boundary E1 where the component area AR1 is in contact with the first adjacent area AR2a to the second boundary E2 (see FIG. 4) where the component area AR1 is in contact with the second adjacent area AR2b. The signal wiring ISL may be maintained in a constant number from the first boundary E1 to the second boundary E2.

Although FIG. 7 illustrates only the connection wiring CWL that do not overlap the signal wiring ISL to describe the arrangement of the signal wiring ISL, in one or more embodiments, the signal wiring ISL and the connection wiring CWL may partially or entirely overlap on a plane, or in plan view.

Referring to FIG. 8, the substrate 100 may include the component area AR1 and the first adjacent area AR2a.

The first pixel circuit PC1 may be arranged in the first adjacent area AR2a. The first pixel circuit PC1 may include the first thin film transistor TFT1, the storage capacitor Cst, and the second thin film transistor TFT2.

The first thin film transistor TFT1 may include the first semiconductor layer Act1, the first gate electrode GE1, the first source electrode SE1, and the first drain electrode DE1. The second thin film transistor TFT2 may include the second semiconductor layer Act2, the second gate electrode GE2, the second source electrode SE2, and the second drain electrode DE2. The storage capacitor Cst may include the lower electrode CE1 and the upper electrode CE2. In one or more embodiments, some of the first source electrode SE1, the first drain electrode DE1, the second source electrode SE2, and the second drain electrode DE2 may be omitted or replaced with other elements.

The signal wiring ISL may be arranged in the component area AR1. The signal wiring ISL is not electrically connected to the first display element DPE1 arranged in the component area AR1, and may be a wiring for transmitting scan signals to the first pixel circuit PC1, the second pixel circuit PC2, and the third pixel circuit PC3 (see FIG. 4). The signal wiring ISL may extend from the first boundary E1 (see FIG. 4), where the component area AR1 is in contact with the first adjacent area AR2a, to the second boundary E2 (see FIG. 4), where the component area AR1 is in contact with the second adjacent area AR2b. Accordingly, the signal wiring ISL may be maintained in a constant number while the signal wiring ISL passes through the component area AR1.

In one or more embodiments, the signal wiring ISL may include the same material as any one of the first gate electrode GE1, the upper electrode CE2, and the second gate electrode GE2. In the specification, when "A" and "B" include the same material, it may mean that the "A" and "B" are formed during the same process. For example, the signal wiring ISL may be formed in the same process as any one of the first gate electrode GE1, the upper electrode CE2, and the second gate electrode GE2. In one or more embodiments, the signal wiring ISL may include a plurality of signal wiring lines, and each of the signal wiring lines of the signal wiring ISL may include the same material as any one of the first gate electrode GE1, the upper electrode CE2, and the second gate electrode GE2. For example, the signal wiring lines of the signal wiring ISL may be arranged on different layers to avoid overlapping each other.

The connection data lines IDL may be further arranged in the component area AR1. The connection data lines IDL are not electrically connected to the first display element DPE1 arranged in the component area AR1, and may be a part of the data line DL (see FIG. 4) for transmitting a data signal or a data voltage to the third pixel circuit PC3. The connection data lines IDL may extend from the third boundary E3 (see FIG. 4), where the component area AR1 is in contact with the main area AR3 (see FIG. 4), to the fourth boundary E4 (see FIG. 4), where the component area AR1 is in contact with the main area AR3. The connection data lines IDL may be maintained in a constant number while passing through the component area AR1. The connection data lines IDL may be arranged adjacent to the first boundary E1 (see FIG. 4) and the second boundary E2 (see FIG. 4) of the component area AR1. Accordingly, the connection data lines IDL are not arranged, or are arranged to a minimum in the central portion of the component area AR1, and thus, transmittance may be improved. The connection data lines IDL may include the same material as any one of the first source electrode SE1 and the connection electrode CM. For example, the connection data lines IDL may include a plurality of upper data lines IDLu and a plurality of lower data lines IDLb. The upper data lines IDLu may include the same material as the connection electrode CM, and the lower data lines IDLb may include the same material as the first source electrode SE1. In other words, the lower data lines IDLb may be located on the interlayer insulating layer 119, and the upper data lines IDLu may be located on the first organic insulating layer 121.

The connection wiring CWL may include the same material as any one of the first gate electrode GE1, the upper electrode CE2, the second gate electrode GE2, the first source electrode SE1, and the connection electrode CM. Accordingly, the connection wiring CWL may be formed in the same process as any one of the first gate electrode GE1, the upper electrode CE2, the second gate electrode GE2, the first source electrode SE1, and the connection electrode CM. Although FIG. 8 illustrates only one connection wiring CWL, as illustrated in FIG. 7, the connection wiring CWL may include a plurality of connection wiring lines. In this state, each of the connection wiring lines of the connection wiring CWL may include the same material as at least any one of the first gate electrode GE1, the upper electrode CE2, the second gate electrode GE2, the first source electrode SE1, and the connection electrode CM. For example, each of the connection wiring lines of the connection wiring CWL may be arranged on different layers to avoid overlapping each other.

In one or more embodiments, the connection wiring CWL may include partial connection wiring lines arranged on different layers. For example, the connection wiring CWL may include partial connection wiring lines arranged on the first gate insulating layer 112, the second inorganic insulating layer 115, or the second gate insulating layer 117, to reduce or prevent the likelihood of contact with the signal wiring ISL arranged on the first inorganic insulating layer 113. The partial connection wiring lines arranged on different layers may be electrically connected to each other through a contact hole, thereby forming one connection wiring CWL. Likewise, the signal wiring ISL may include partial signal wiring lines arranged on or above the first gate insulating layer 112, the first inorganic insulating layer 113, or the second gate insulating layer 117, to prevent contact with the connection wiring CWL.

The organic light-emitting diode OLED may be electrically connected to the first pixel circuit PC1. The organic light-emitting diode OLED is electrically connected to the first pixel circuit PC1 arranged in the first adjacent area AR2a, and may implement the first display element DPE1. The organic light-emitting diode OLED may include the pixel electrode 211, the emission layer 212, and the counter electrode 213.

The pixel electrode 211 may be electrically connected to the connection electrode CM through the contact holes formed in the second organic insulating layer 123 and the third organic insulating layer 125. The connection wiring CWL extends from the first pixel circuit PC1 to at least one pixel electrode 211, and is electrically connected to, and runs through, the connection electrode CM or the pixel electrode 211. Accordingly, the number of connection wiring lines of the connection wiring CWL decreases as the connection wiring lines are closer to the central area CA from the first boundary E1 in the first direction, for example, the x direction. Accordingly, the transmittance of the central area CA may be greater than the transmittance of the boundary area BA.

Figure 9:
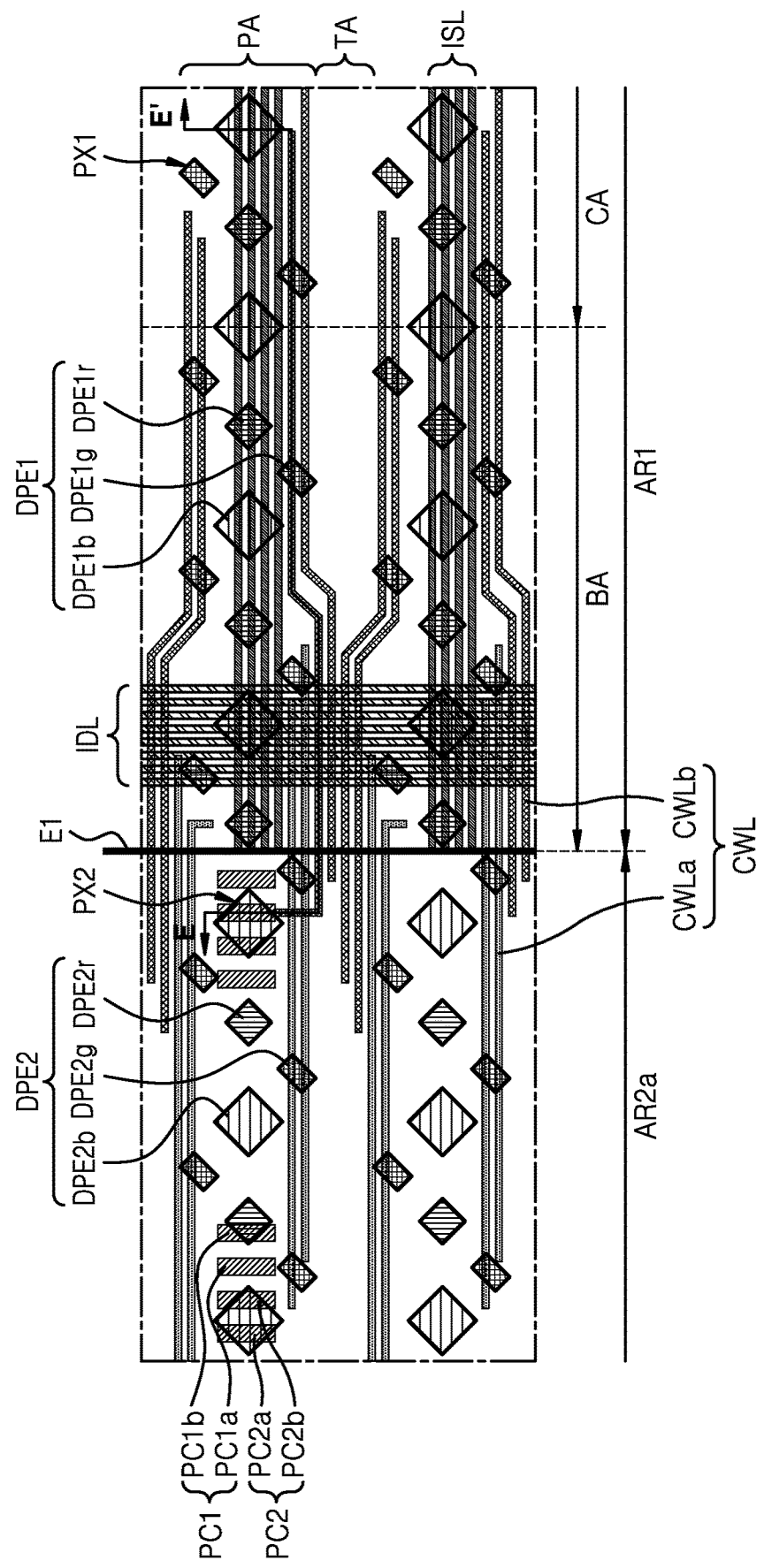
FIG. 9 is a schematic enlarged view of a boundary portion between an adjacent area and a component area in a display panel according to one or more embodiments.
Figure 10:
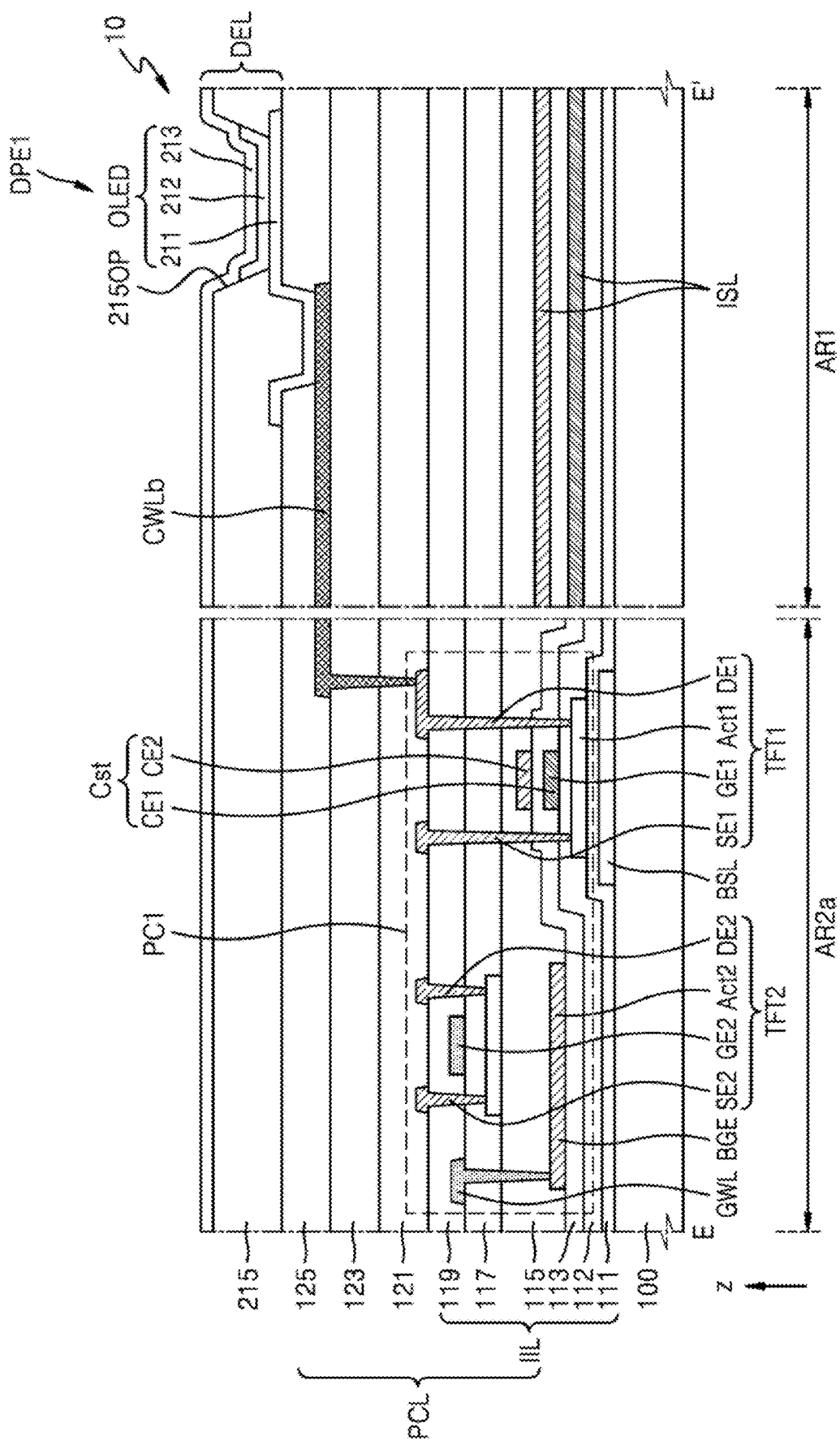
FIG. 10 is a cross-sectional view of the display panel of FIG. 9, taken along the line E-E'.

FIG. 9 is a schematic enlarged view of a boundary portion between an adjacent area and a component area in a display panel according to one or more embodiments, and FIG. 10 is a cross-sectional view of the display panel of FIG. 9, taken along the line E-E'.

Referring to FIGS. 9 and 10, the component area AR1 may include the boundary area BA adjacent to the first boundary E1 and the central area CA. FIG. 9 is similar to FIG. 7, but is different from FIG. 7 in that, while a first connection wiring CWLa connected to the boundary area BA includes a metal material, a second connection wiring CWLb connected to the central area CA includes a transparent conductive material. In other words, when the first display element DPE1 corresponding to the connection wiring CWL is close to the center of the component area AR1, the connection wiring CWL may include a transparent conductive material, and when the first display element DPE1 corresponding to the connection wiring CWL is close to the first boundary E1 or the second boundary E2 (see FIG. 4) of the component area AR1, the connection wiring CWL may include a metal material.

In one or more embodiments, the second connection wiring CWLb may include a transparent conducting oxide. For example, the second connection wiring CWLb may include a conductive oxide, such as ITO, IZO, ZnO, $In_2O_3$, IGO, or AZO. As the second connection wiring CWLb that overlaps the component area AR1 includes a transparent conductive material, the transmittance of the component area AR1 may be improved. Furthermore, as the second connection wiring CWLb including a transparent conductive material is arranged in the central area CA of the component area AR1, the central area CA may have a higher transmittance than the boundary area BA.

In one or more embodiments, the second connection wiring CWLb may be located between the second organic insulating layer 123 and the third organic insulating layer 125. In one or more embodiments, the second connection wiring CWLb may include a plurality of second connection wiring lines, and one or more organic insulating layers may be located between the third organic insulating layer 125 and the pixel electrode 211, and some of the second connection wiring CWLb may be located between the organic insulating layers. The pixel electrode 211 may be electrically connected to the second connection wiring CWLb through the contact hole formed in the third organic insulating layer 125.

FIGS. 11 to 14 are enlarged views of a part of the component area of the display panel of FIG. 6.

Figure 11:
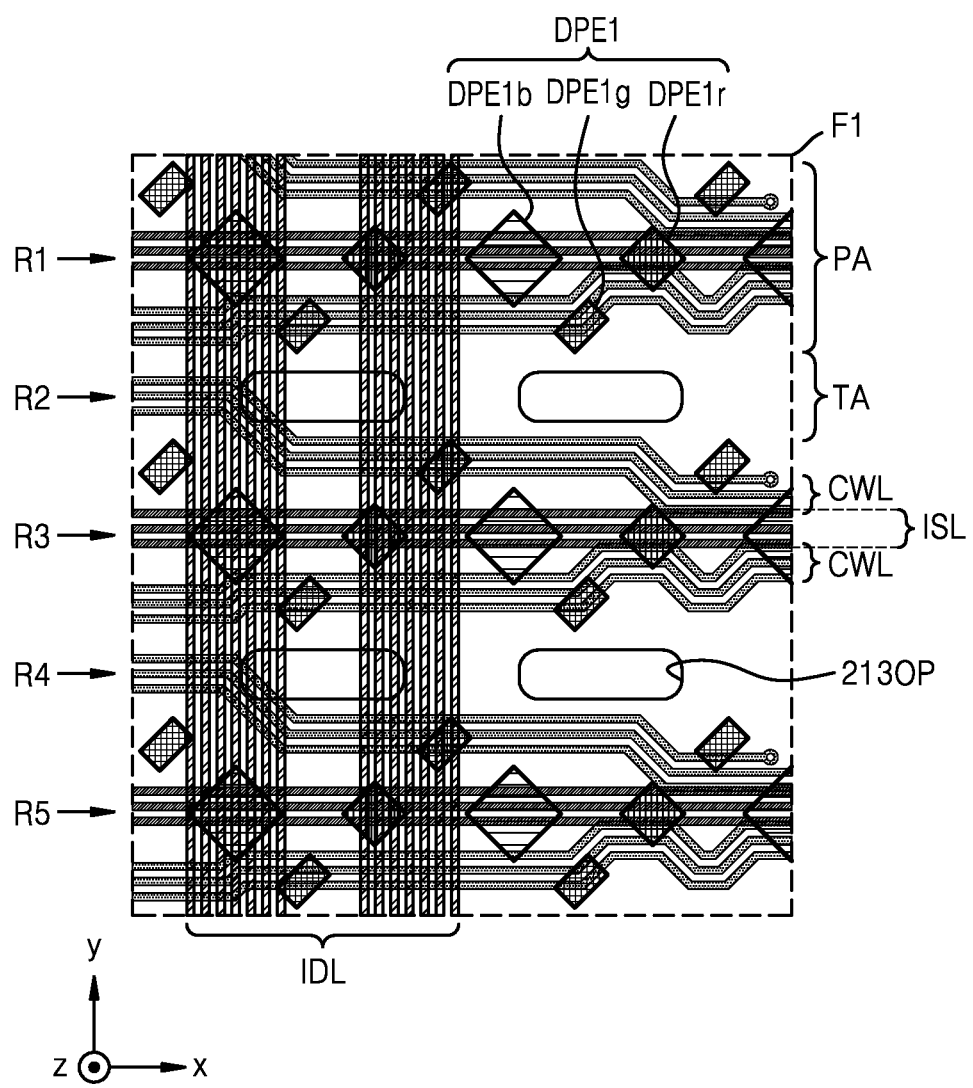
FIGS. 11 to 14 are enlarged views of a part of the component area of the display panel of FIG. 6.
Figure 12:
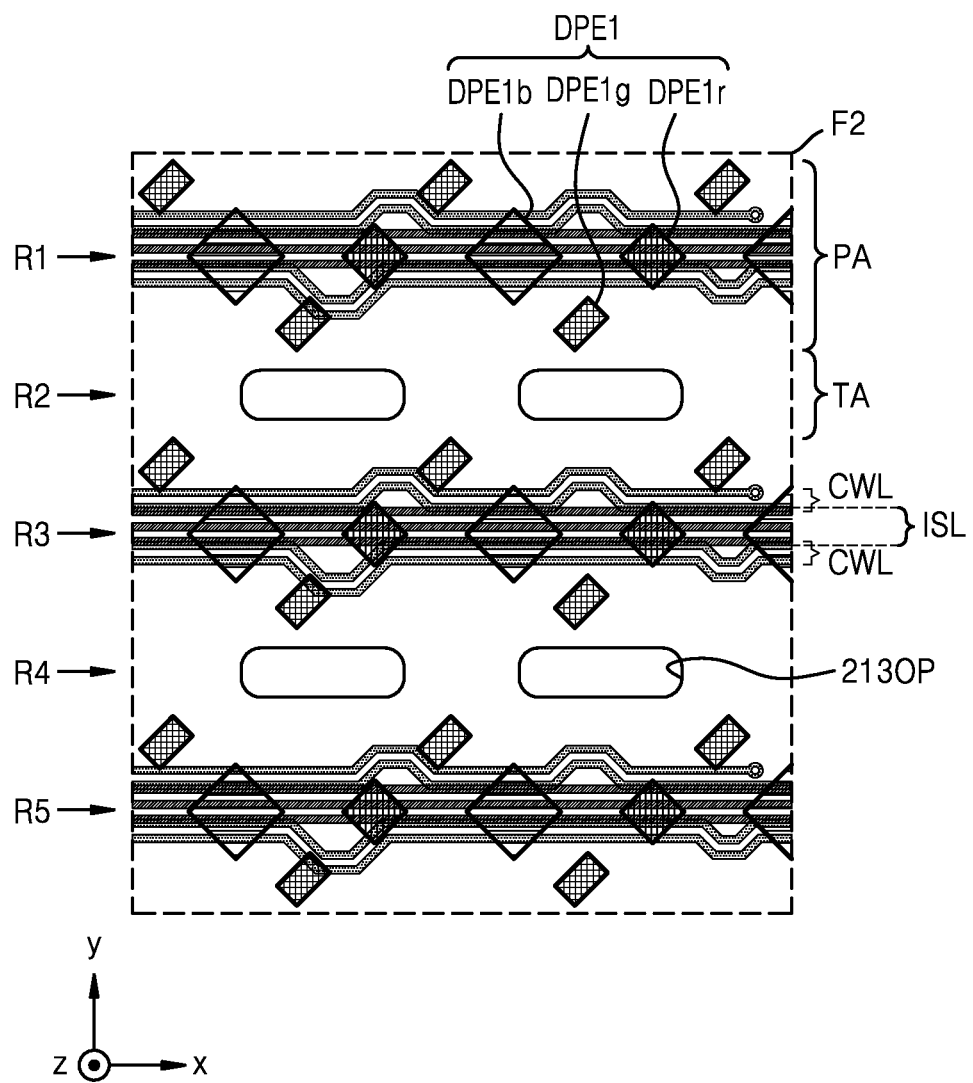
Figure 13:
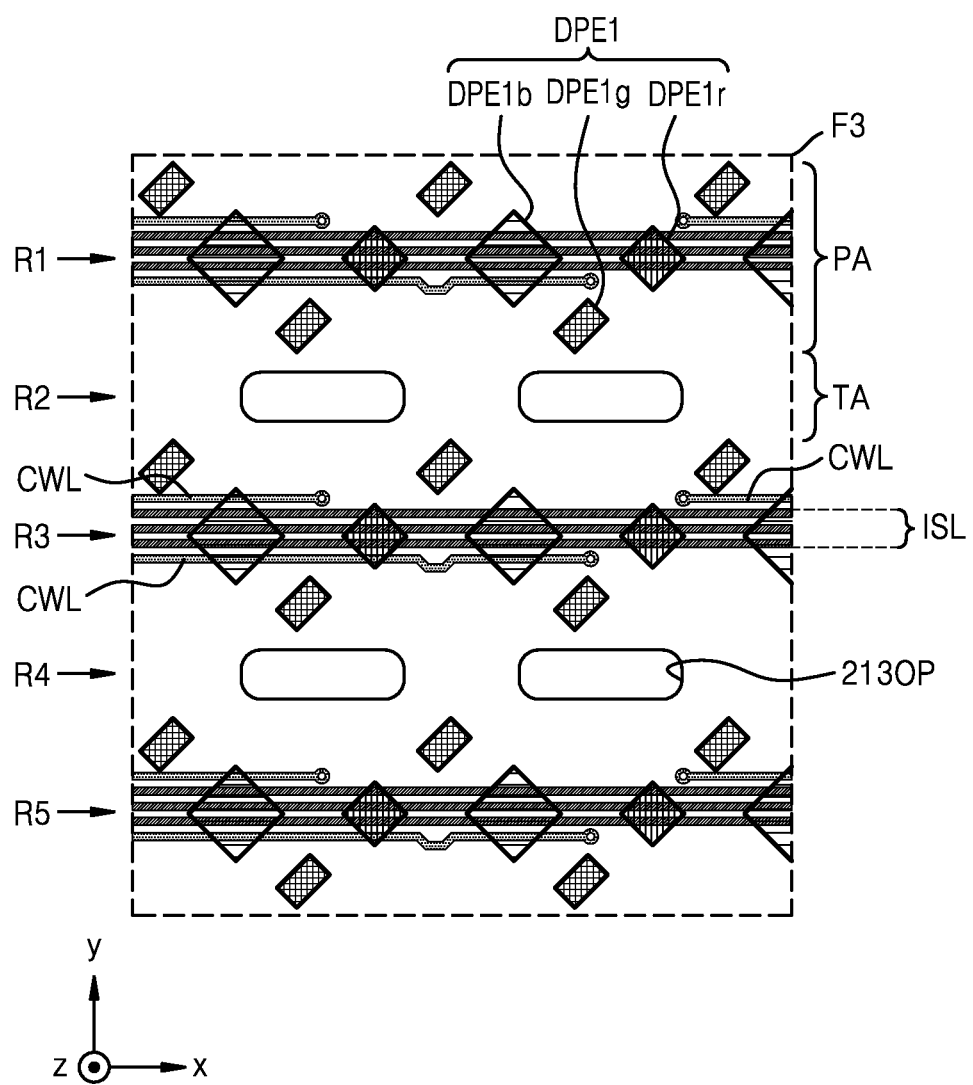

FIGS. 11 to 13 illustrate the arrangement of the connection wiring CWL and the signal wiring ISL in each of regions F1, F2, and F3 of the component area AR1 of the display panel 10 of FIG. 6. The region F1 is included in the boundary area BA of the component area AR1, the region F3 is included in the central area CA of the component area AR1, and the region F2 is located between the regions F1 and F3.

Referring to FIGS. 11 to 13 and in conjunction with FIG. 6, the first display element DPE1 may overlap the pixel area PA extending in the first direction, for example, the x direction. For example, the emission area of the first display element DPE1 may overlap the pixel area PA. One pixel area PA and another pixel area PA may be arranged apart from each other in the second direction, for example, the y direction, and the transmission area TA may be arranged between the pixel areas PA. For example, the pixel area PA and the transmission area Ta may be alternately arranged such that the pixel area PA forms odd-numbered rows R1, R3, and R5, and the transmission area TA forms an even-numbered rows R2 and R4.

The connection data lines IDL may be arranged adjacent to the first boundary E1 (see FIG. 6). The connection data lines IDL may extend in the second direction, for example, the y direction, to pass through the component area AR1. For example, the connection data lines IDL may be a part of the data line DL (see FIG. 4) that is electrically connected to the third pixel circuit PC3 (see FIG. 4) arranged in the main area AR3 (see FIG. 4) to transmit a data signal or a data voltage therethrough. Accordingly, the connection data lines IDL are not electrically connected to the first display element DPE1, and may be maintained in a constant number in the component area AR1.

The signal wiring ISL may overlap the pixel area PA. The signal wiring ISL is not electrically connected to the first display element DPE1 arranged in the component area AR1, and may be a wiring for transmitting a scan signal to the first pixel circuit PC1, the second pixel circuit PC2, and the third pixel circuit PC3 shown in FIG. 4. The signal wiring ISL may extend from the first boundary E1 where the component area AR1 is in contact with the first adjacent area AR2a to the second boundary E2 where the component area AR1 is in contact with the second adjacent area AR2b (see FIG. 4). Accordingly, the signal wiring ISL may be maintained in a constant number while passing through the component area AR1.

The connection wiring CWL may overlap the pixel area PA. The connection wiring CWL may partially overlap the transmission area TA adjacent to the first boundary E1. For example, the connection wiring CWL, which is arranged at the first boundary E1 between the emission area of the first display element DPE1, may extend in the first direction, for example, the x direction, to overlap the pixel area PA. In one or more embodiments, some of the connection wiring lines of the connection wiring CWL may be arranged to partially or entirely overlap the signal wiring ISL on a plane. For example, the connection wiring CWL may be arranged on a different layer from the signal wiring ISL. The connection wiring CWL may be electrically connected to, and may run through, the first display element DPE1 corresponding thereto. Accordingly, the number of connection wiring lines of the connection wiring CWL may decrease as the connection wiring lines are closer to the central area CA. Accordingly, the component area AR1 may have the highest transmittance at the center thereof.

Figure 14:
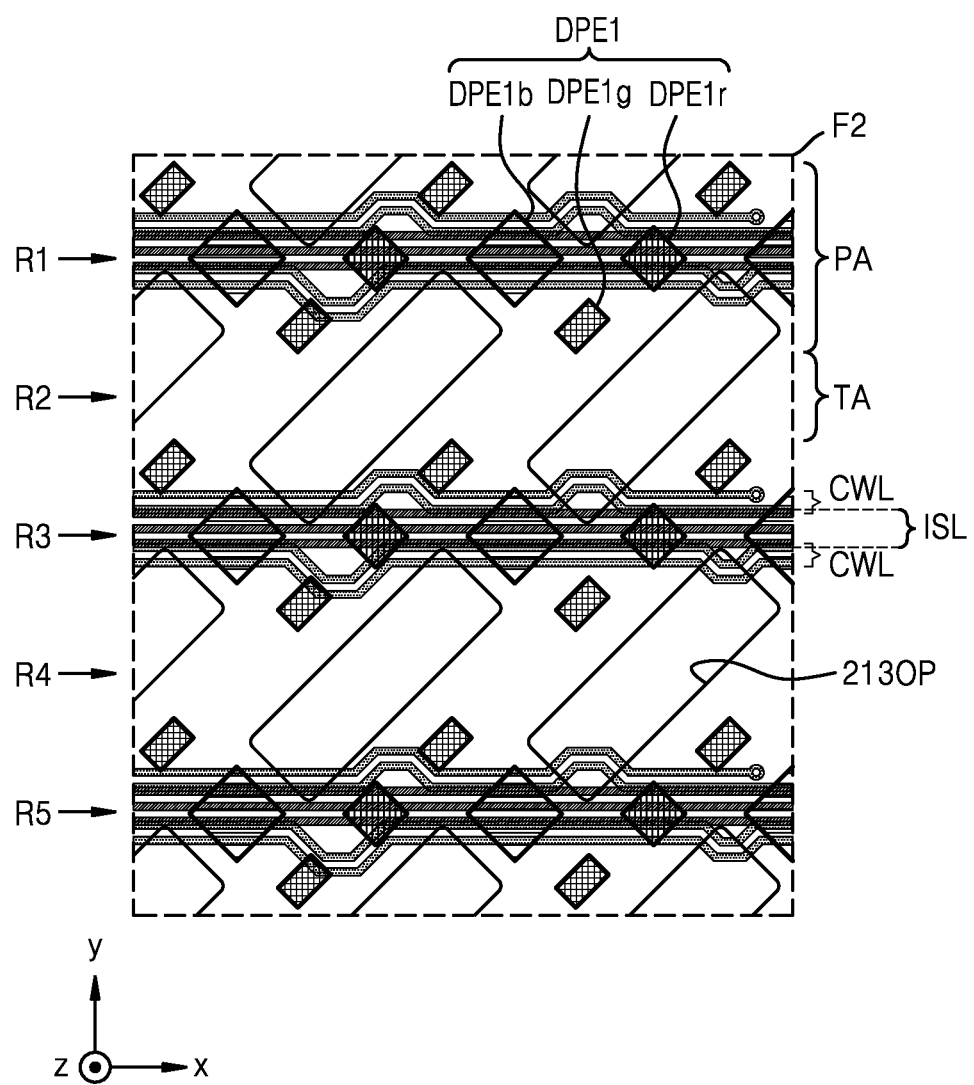

An opening 213OP of the counter electrode 213 (see FIG. 8) may overlap the transmission area TA. The openings 213OP of the counter electrode 213 may be arranged apart from each other in the first direction, for example, the x direction. In one or more embodiments, the opening 213OP of the counter electrode 213 may have an oval shape. In the component area AR1, the major axis of the opening 213OP of the counter electrode 213 is parallel to an extension direction of the signal wiring ISL, thereby reducing overlapping with the signal wiring ISL and the connection wiring CWL. In one or more other embodiments, the opening 213OP of the counter electrode 213 may have a polygonal shape. For example, as illustrated in FIG. 14, the opening 213OP of the counter electrode 213 may have a rectangular shape having the major axis parallel to a third direction crossing the first direction, for example, the x direction, in which the transmission area TA extends. In addition, the opening 213OP of the counter electrode 213 may have various shapes for improvement of the transmittance of the transmission area TA.

Figure 15:
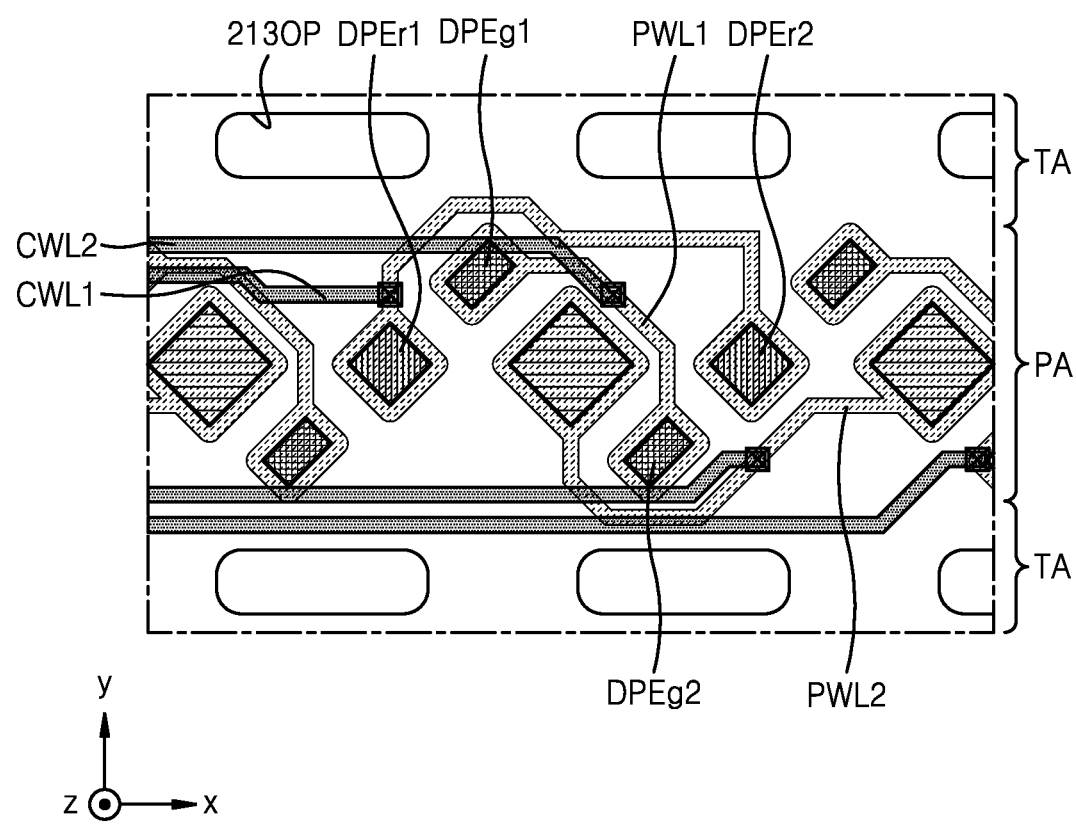
FIG. 15 is an enlarged view of a part of the component area of the display panel of FIG. 6.

FIG. 15 is an enlarged view of a part of the component area of the display panel of FIG. 6.

Referring to FIG. 15, the first display element DPE1 corresponding to one connection wiring CWL may include one or more first display elements. For example, a first green display element DPEg1 arranged in the component area AR1 may be electrically connected to a second green display element DPEg2 adjacent thereto through an auxiliary wiring PWL1. In other words, the first green display element DPEg1 and the second green display element DPEg2 may be driven by one first pixel circuit PC1 (see FIG. 6) connected through a second connection wiring CWL2. Accordingly, while using a small number of connection wiring lines, the resolution of the component area AR1 is improved so that user's aesthetics may be satisfied.

According to one or more embodiments described above, as a first pixel circuit for driving first display elements arranged in a component area is arranged in an adjacent area, a display apparatus with improved transmittance of the component area may be implemented.

Furthermore, by reducing wirings passing through the central area of the component area, a sufficient area for transmitting light or sound may be secured. The scope of the disclosure is not limited by the effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising: a substrate comprising a component area, an adjacent area comprising a first adjacent area and a second adjacent area, wherein the component area is arranged between the first adjacent area and the second adjacent area, and a main area at least partially surrounding the component area and the adjacent area in plan view, the component area, the first adjacent area, the second adjacent area respectively comprising pixels for displaying an image, and the component area having a transmittance that is greater than a transmittance of the first adjacent area or the second adjacent area; a first display element in the component area and comprising a pixel electrode, an emission layer on the pixel electrode, and a counter electrode; a second display element, a first pixel circuit electrically connected to the first display element, and a second pixel circuit electrically connected to the second display element, in the adjacent area; a signal wiring in the component area, adjacent to the pixel electrode, and extending in a first direction from a boundary where the component area contacts the first adjacent area; and a connection wiring adjacent to the pixel electrode and electrically connecting the first display element to the first pixel circuit.

2. The display apparatus of claim 1, wherein the first pixel circuit comprises a first thin film transistor and a second thin film transistor, wherein the first thin film transistor comprises a first semiconductor layer, a first gate electrode, an upper electrode, and a first source-drain electrode, wherein the second thin film transistor comprises a second semiconductor layer, a second gate electrode, and a second source-drain electrode, and wherein the connection wiring comprises connection wiring lines comprising a same material as the first gate electrode, the upper electrode, the second gate electrode, or the first source-drain electrode.

3. The display apparatus of claim 2, further comprising a first organic insulating layer, a second organic insulating layer, and a third organic insulating layer that are sequentially stacked between the first pixel circuit and the first display element,
wherein the connection wiring lines further comprise a transparent connection wiring between the second organic insulating layer and the third organic insulating layer and comprising a transparent conductive material.

4. The display apparatus of claim 3, wherein the component area comprises a first boundary area contacting the first adjacent area, a second boundary area contacting the second adjacent area, and a central area between the first boundary area and the second boundary area,
wherein one of the connection wiring lines having an end portion in the central area comprises a transparent conductive material, and
wherein another of the connection wiring lines having an end portion in the first boundary area or the second boundary area comprises a metal material.

5. The display apparatus of claim 2, wherein the signal wiring comprises signal wiring lines comprising a same material as the first gate electrode, the upper electrode, or the second gate electrode.

6. The display apparatus of claim 5, wherein some of the connection wiring lines and some of the signal wiring lines overlap each other in the plan view.

7. The display apparatus of claim 5, wherein some of the connection wiring lines comprise partial connection wiring lines comprising a same material as the first gate electrode, the upper electrode, the second gate electrode, or the first source-drain electrode.

8. The display apparatus of claim 1, wherein the signal wiring comprises signal wiring lines, and
wherein a number of the signal wiring lines is the same at a boundary where the component area contacts the first adjacent area as at the boundary where the component area contacts the second adjacent area.

9. The display apparatus of claim 1, further comprising connection data lines arranged in the component area and extending in a second direction crossing the first direction,
wherein the component area comprises a first boundary area contacting the first adjacent area, a second boundary area contacting the second adjacent area, and a central area between the first boundary area and the second boundary area, and
wherein the connection data lines overlap the first boundary area or the second boundary area.

10. The display apparatus of claim 9, further comprising a first organic insulating layer and a second organic insulating layer that are sequentially stacked between the first pixel circuit and the first display element,
wherein the connection data lines comprise a lower data line below the first organic insulating layer, and an upper data line between the first organic insulating layer and the second organic insulating layer.

11. The display apparatus of claim 1, further comprising:
a first adjacent data line in the adjacent area and electrically connected to the first pixel circuit; and
a second adjacent data line in the adjacent area and electrically connected to the second pixel circuit.

12. The display apparatus of claim 11, wherein the first adjacent data line and the second adjacent data line respectively comprise first adjacent data lines and second adjacent data lines that are alternately arranged.

13. The display apparatus of claim 11, wherein the first adjacent data line is integrated circuit (IC) mapped corresponding to a location of the first display element.

14. The display apparatus of claim 1, wherein the first display element comprises first display elements, and
wherein the display apparatus further comprises an auxiliary wiring that electrically connects any one of the first display elements to another of the first display elements.

15. A display apparatus comprising:
a substrate comprising a component area, an adjacent area comprising a first adjacent area and a second adjacent area, wherein the component area is arranged between the first adjacent area and the second adjacent area, and a main area at least partially surrounding the component area and the adjacent area in plan view;
a first display element in the component area and comprising a pixel electrode, an emission layer on the pixel electrode, and a counter electrode;
a second display element, a first pixel circuit electrically connected to the first display element, and a second pixel circuit electrically connected to the second display element, in the adjacent area;
a signal wiring in the component area, adjacent to the pixel electrode, and extending in a first direction from a boundary where the component area contacts the first adjacent area; and
a connection wiring adjacent to the pixel electrode and electrically connecting the first display element to the first pixel circuit,
wherein the connection wiring comprises connection wiring lines, and
wherein a number of the connection wiring lines decreases as a distance from any one of respective boundaries, where the component area contacts the first adjacent area and the second adjacent area, toward a center of the component area increases.

16. A display apparatus comprising:
a substrate comprising a component area, an adjacent area comprising a first adjacent area and a second adjacent area, wherein the component area is arranged between the first adjacent area and the second adjacent area, and a main area at least partially surrounding the component area and the adjacent area in plan view;
a first display element in the component area and comprising a pixel electrode, an emission layer on the pixel electrode, and a counter electrode;
a second display element, a first pixel circuit electrically connected to the first display element, and a second pixel circuit electrically connected to the second display element, in the adjacent area;
a signal wiring in the component area, adjacent to the pixel electrode, and extending in a first direction from a boundary where the component area contacts the first adjacent area; and
a connection wiring adjacent to the pixel electrode and electrically connecting the first display element to the first pixel circuit,
wherein the component area extends in the first direction, and comprises pixel areas, in which pixel electrodes, which comprise the pixel electrode, are arranged, and transmission areas between the pixel areas, and
wherein the counter electrode defines openings overlapping the transmission areas.

17. The display apparatus of claim 16, wherein the openings have an oval shape having a major axis parallel to the first direction.

18. The display apparatus of claim 16, wherein the openings have an area overlapping the connection wiring, and decreasing toward a center of the component area from respective boundaries where the component area contacts the first adjacent area and the second adjacent area.

19. The display apparatus of claim 17, wherein the connection wiring and the signal wiring overlap one of the pixel areas.

20. The display apparatus of claim 17, wherein the connection wiring overlaps one of the transmission areas at respective boundaries where the component area contacts the first adjacent area and the second adjacent area.

* * * * *